United States Patent
Fukamachi et al.

(10) Patent No.: US 7,057,472 B2
(45) Date of Patent: Jun. 6, 2006

(54) BYPASS FILTER, MULTI-BAND ANTENNA SWITCH CIRCUIT, AND LAYERED MODULE COMPOSITE PART AND COMMUNICATION DEVICE USING THEM

(75) Inventors: Keisuke Fukamachi, Saitama-ken (JP); Shigeru Kemmochi, Meerbusch (DE); Mitsuhiro Watanabe, Saitama-ken (JP); Tsuyoshi Taketa, Tottori-ken (JP); Hiroyuki Tai, Tottori-ken (JP); Satoru Yokouchi, Tottori-ken (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/486,326

(22) PCT Filed: Aug. 12, 2002

(86) PCT No.: PCT/JP02/08215

§ 371 (c)(1),
(2), (4) Date: Aug. 27, 2004

(87) PCT Pub. No.: WO03/015301

PCT Pub. Date: Feb. 20, 2003

(65) Prior Publication Data

US 2004/0266378 A1    Dec. 30, 2004

(30) Foreign Application Priority Data

Aug. 10, 2001  (JP)  .............................. 2001-244343
Aug. 31, 2001  (JP)  .............................. 2001-264843
Mar. 18, 2002  (JP)  .............................. 2002-073910

(51) Int. Cl.
*H01P 1/10*     (2006.01)
*H03H 7/46*     (2006.01)

(52) U.S. Cl. ..................... 333/101; 333/132; 333/185

(58) Field of Classification Search ................ 333/101, 333/104, 132, 133, 185
See application file for complete search history.

(56) References Cited

U.S. PATENT DOCUMENTS 4,147,980 A * 4/1979 Frosch ......................... 455/81

(Continued)

FOREIGN PATENT DOCUMENTS

| EP | 0 932 216 A1 | 7/1999 |
| EP | 1 037 308 A1 | 9/2000 |
| EP | 1 083 672 A1 | 3/2001 |

(Continued)

*Primary Examiner*—Dean Takaoka
(74) *Attorney, Agent, or Firm*—Finnegan, Henderson, Farabow, Garrett & Dunner, L.L.P.

(57) ABSTRACT

A multi-band antenna switch circuit including a diplexer connected to an antenna terminal for demultiplexing signals of different passing bands, a first and a second switch circuit for switching a high frequency signal and a low frequency signal demultiplexed by the diplexer to a plurality of transmission/reception terminals, a first and a second low pass filter connected to a transmission path between the diplexer and the transmission terminal or between the first and the second switch circuit and the transmission terminal, and a notch filter provided between the diplexer and the first switch circuit or between the diplexer and the second switch circuit. The multi-band antenna switch circuit includes a high pass filter having an input terminal and an output terminal and provided at least between the diplexer and the antenna terminal and including a first inductor connected between the input terminal and the ground, a first capacitor connected between the input terminal and the output terminal, a second inductor connected to the output terminal, and a second capacitor connected between the second inductor and the ground.

21 Claims, 17 Drawing Sheets

| U.S. PATENT DOCUMENTS | | | | FOREIGN PATENT DOCUMENTS | | |
|---|---|---|---|---|---|---|
| 5,768,691 A | 6/1998 | Matero et al. ........... 455/78 | | JP | 11-225088 | 8/1999 |
| 5,793,265 A * | 8/1998 | Spielman ................ 333/132 | | JP | 2000-165288 | 6/2000 |
| 5,815,804 A | 9/1998 | Newell et al. ........... 455/78 | | JP | 2001-044883 | 2/2001 |
| 6,058,000 A | 5/2000 | Koenck et al. | | JP | 2001044884 | 2/2001 |
| 6,115,585 A | 9/2000 | Matero et al. ........... 455/78 | | JP | 2001-186047 | 7/2001 |
| 6,351,294 B1 | 2/2002 | Yamamoto et al. ...... 348/731 | | WO | WO 00/51012 | 8/2000 |
| 6,633,748 B1 * | 10/2003 | Watanabe et al. ....... 455/78 | | | | |
| 6,731,184 B1 * | 5/2004 | Muto et al. ............. 333/103 | | | | |

* cited by examiner

US 7,057,472 B2

BYPASS FILTER, MULTI-BAND ANTENNA SWITCH CIRCUIT, AND LAYERED MODULE COMPOSITE PART AND COMMUNICATION DEVICE USING THEM

CROSS REFERENCE TO RELATED APPLICATIONS

This application is a national phase application based on PCT/JP02/08215, filed Aug. 12, 2002, the content of which is incorporated herein by reference, and claims the priority of Japanese Patent Application No. 2001-244343, filed Aug. 10, 2001, Japanese Patent Application No. 2001-264843, filed Aug. 31, 2001, and Japanese Patent Application No. 2002-073910, filed Mar. 18, 2002.

FIELD OF THE INVENTION

The present invention relates to a wireless communications system connected to a common antenna for transmitting and receiving two or more signals having different frequencies, particularly to a multiband antenna switch circuit, and a composite laminate multiband antenna switch module and a communications device both comprising the multiband antenna switch circuit.

BACKGROUND OF THE INVENTION

There are various systems for mobile phones, for instance, EGSM (extended global system for mobile communications) and DCS (digital cellular system) widely used mostly in Europe, PCS (personal communications services) used in the U.S., and various systems using TDMA (time division multiple access) such as PDC (personal digital cellular) used in Japan. According to recent rapid expansion of mobile phones, however, a frequency band allocated to each system cannot allow all users to use their mobile phones in major cities in advanced countries, resulting in difficulty in connection and thus causing such a problem that mobile phones are sometimes disconnected during communication. Thus, proposal was made to permit users to utilize a plurality of systems, thereby increasing substantially usable frequency, and further to expand serviceable territories and to effectively use communications infrastructure of each system.

To utilize a plurality of systems, a user should have a plurality of mobile phones each adapted for each system, or a small, lightweight mobile phone capable of communicating in plural systems. In the latter case, to make one mobile phone adaptable for a plurality of systems, the mobile phone should comprise parts for every system. For instance, in a system of transmitting signals, high-frequency circuit parts, such as filters for passing transmission signals of desired transmission frequencies, high-frequency switches for switching transmitting circuits and receiving circuits, and an antenna for receiving and emitting transmitting/receiving signals, are needed for every system. In a system of receiving signals, for instance, high-frequency circuit parts such as filters for passing received signals of desired frequencies among those passing the high-frequency switches are needed for every system. Accordingly, such mobile communications devices are not only expensive but also have unsuitably large volume and weight.

Small and lightweight high-frequency circuit parts adapted for a plurality of systems are thus demanded. For instance, JP 11-225088 A (EP 0921642 A3) discloses a dualband antenna switch module adapted for EGSM and DCS. FIG. 30 is a circuit block diagram showing a dualband antenna switch module adapted for the EGSM system (transmission frequency: 880 to 915 MHz, receiving frequency: 925 to 960 MHz) and the DCS system (transmission frequency: 1710 to 1785 MHz, receiving frequency: 1805 to 1880 MHz). A diplexer Dip branches an EGSM signal in 0.9 GHz band and a DCS signal in 1.8 GHz band, a first high-frequency switch SW1 switches connection to an EGSM transmission terminal (Tx) and an EGSM receiving terminal (Rx), a second high-frequency switch SW2 switches connection to a DCS transmission terminal (Tx) and a DCS receiving terminal (Rx). Lowpass filters LPF1, LPF2 reduce harmonic strain generated by a power amplifier on the transmission side.

JP 2000-165288 A (EP 0998035 A3) discloses a tripleband antenna switch module for mobile communications devices adapted for three systems of EGSM, DCS and PCS.

As a next generation mobile wireless system, the service of a W-CDMA (wide-band code division multiple access) system is starting, and it is expected to rapidly spread because of a higher data transmission rate, multichannel communications, etc. Accordingly, mobile wireless devices adapted for W-CDMA in addition to EGSM, DCS, PCS, etc. presently predominant among mobile phone communications systems have become necessary.

FIG. 31 is a circuit block diagram showing an antenna switch module adapted for three bands of EGSM, DCS and W-CDMA (transmission frequency: 1920 to 1980 MHz, receiving frequency: 2110 to 2170 MHz). A diplexer Dip branches signals in a frequency band of EGSM and signals in a frequency band of DCS/W-CDMA. Though it synthesizes signals in an opposite direction, only "branching" will be explained here for simplicity. A first high-frequency switch SW1 switches connections to an EGSM transmission terminal (Tx) and an EGSM receiving terminal (Rx), while the second high-frequency switch SW2 switches connections to a DCS transmission terminal (Tx), a DCS receiving terminal (Rx) and a transmitting/receiving terminal of W-CDMA. Lowpass filters LPF1, LPF2 reduce harmonic strain generated by power amplifiers on the transmission sides.

However, the above conventional technologies have the following problems.

(1) Breakdown of High-Frequency Parts by Electrostatic Surge

High-frequency parts such as pin diodes, FET switches, etc. used in the high-frequency switch circuits shown in FIGS. 30 and 31 are vulnerable to electrostatic charge. Particularly in the case of mobile phones, the above high-frequency parts are subjected to breakdown when electrostatic surge from human bodies is input into antennas. In addition, though an antenna switch module per se is not subjected to breakdown, circuits connected downstream of the antenna switch module, such as power amplifiers and low-noise amplifiers, etc. connected to transmission terminals and receiving terminals, respectively, of the antenna switch module are likely subjected to breakdown. Therefore, measures for electrostatic surge have been important.

As a technology for removing electrostatic surge, a circuit shown in FIG. 32(a), which is described in JP 2001-186047 A, has conventionally been known. This circuit comprises an inductor connected to a ground, which is connected to part of two diplexers. To protect high-frequency parts from electrostatic surge by this circuit, the inductor connected to the ground should be 5 nH or less. When an inductor of 5 nH or less is connected to an antenna top, however, it is difficult to secure matching in a wide band from 900 MHz to 1.8

GHz. Attenuation near 300 MHz is actually as small as 5 dB or less in this circuit, insufficient for the removal of electrostatic surge.

JP 2001-44883 A discloses a circuit shown in FIG. 32(b), in which an inductor connected to a ground and a capacitor are disposed in a signal line of each of an antenna terminal ANT, a transmission terminal Tx and a receiving terminal Rx. However, the insertion of an LC filter comprising an inductor L1 and a capacitor C1 in each of the antenna terminal, the transmission terminal and the receiving terminal not only prevents the miniaturization and cost reduction of a high-frequency switch, but also causes the deterioration of insertion loss. Attenuation near 300 MHz is actually as small as about 5 dB in this circuit, insufficient for the removal of electrostatic surge.

Though it may be considered to use varistor diodes and Zener diodes as electrostatic-surge-removing parts, it necessitates a large capacitance between the terminals, inevitably resulting in the deterioration of insertion loss when used in signal lines. Accordingly, the varistor diode and the Zener diode cannot be used to remove electrostatic surge in a high-frequency circuit comprising high-frequency switches.

(2) Generation of Harmonics (in Switch Circuit Comprising Pin Diode)

The circuit shown in FIG. 31 has a problem that harmonic strain is generated by a W-CDMA transmission signal passing through the second high-frequency switch SW2. It is generally known that when a high-power, high-frequency signal is input to a nonlinear device such as a pin diode and a GaAs switch, harmonic strain is generated. Particularly with a pin diode, harmonic strain generation in its OFF state is remarkable. The reasons therefor are clear from the V-I characteristics of the diode shown in FIG. 33. Namely, in an ON state, the diode is driven at an operation point having relatively good linearity by voltage Vc of the control voltage, so that the diode linearly responds to voltage change by high-frequency signals, resulting in less harmonic generation. On the other hand, the operation point of the diode is around V=0 in an OFF state, so that the diode unlinearly responds to voltage change by high-frequency signals, resulting in large harmonic generation.

FIG. 34 is a view showing an equivalent circuit of the tripleband antenna switch circuit shown in FIG. 31 adapted for EGSM, DCS and W-CDMA. Table 1 shows the ON/OFF states of pin diodes and control voltage in each operation mode. In the control voltage, "High" is desirably +1 V to +5 V, and "Low" is desirably −0.5 V to +0.5 V.

TABLE 1

ON/OFF of pin diodes in circuit shown in FIG. 34 in each operation mode

| Mode | Control Voltage | | | ON/OFF States of Pin Diodes | | | | | |
|---|---|---|---|---|---|---|---|---|---|
|  | VC1 | VC2 | VC3 | D1 | D2 | D3 | D4 | D5 | D6 |
| EGSM Tx | High | Low | Low | ON | ON | OFF | OFF | OFF | OFF |
| DCS Tx | Low | High | Low | OFF | OFF | ON | ON | OFF | OFF |
| EGSM Rx | Low | Low | Low | OFF | OFF | OFF | OFF | OFF | OFF |
| DCS Rx | Low | Low | High | OFF | OFF | OFF | OFF | ON | ON |
| W-CDMA | Low | Low | Low | OFF | OFF | OFF | OFF | OFF | OFF |

It is clear from above that the diodes D1, D2 in an ON state are connected to a path from the EGSM TX terminal to the antenna ANT in an EGSM transmission (Tx) mode, while the diodes D3, D4, D5, D6 in an OFF state are separate as a circuit, resulting in reduced harmonic generation.

In a DCS transmission (Tx) mode, too, diodes D3, D4 in an ON state are connected to a path from the DCS TX terminal to the antenna ANT, while the diodes D1, D2, D5, D6 in an OFF state are separate as a circuit, resulting in reduced harmonic generation.

In a W-CDMA mode, diodes D3, D4, D5, D6 in an OFF state are connected to a path from the W-CDMA terminal to the antenna ANT, and when a high-power signal is input from the W-CDMA terminal, a large harmonic signal is emitted from the antenna terminal ANT. This means that a signal that should not be emitted from an antenna of a mobile phone is emitted, a problem unavoidable in the conventional art.

(3) Miniaturization, Power Saving and Harmonic Generation (when FET Switch is Used)

The high-frequency switch module shown in FIG. 30 needs four pin diodes in total, and the high-frequency switch module shown in FIG. 31 needs six pin diodes in total, thereby preventing their miniaturization and power saving. Generally, a switch circuit comprising a GaAs switch has less power consumption than that comprising a pin diode.

U.S. Pat. No. 5,815,804 discloses, as shown in FIG. 35, an example comprising a diplexer Dip1 on a transmitting side for branching an EGSM transmission terminal (Tx) and a DCS transmission terminal (Tx), a diplexer Dip2 on a receiving side for branching an EGSM receiving terminal (Rx) and a DCS receiving terminal (Rx), and one FET switch such as a GaAs switch, etc. as a switch circuit SW for switching the diplexers Dip1 and Dip2. In this case, the miniaturization and the reduction of power consumption can be achieved than in a switch circuit comprising pin diodes. However, because the switch circuit SW is connected to the diplexer Dip1 on a transmitting side in an EGSM transmission mode, there is a problem that a DCS band signal supplied from the DCS transmission terminal (Tx) also passes. Though a power amplifier on the DCS side is set not to be operated in an EGSM transmission mode, a signal is slightly generated from the power amplifier on the DCS side because of oscillation by a second harmonic of the EGSM transmission signal and crosstalk with an amplifier on the EGSM. This phenomenon is particularly remarkable in the case of a dual power amplifier comprising two power amplifiers of EGSM and DCS in one package, so that a signal of about −15 dBm may be output from the power amplifier on the DCS side. Namely, a signal of 1.8 GHz corresponding to two times the frequency of the EGSM transmission band is input into the DCS transmission terminal in an EGSM transmission mode, and the diplexer Dip1 and the switch SW permit a signal of 1.8 GHz to pass through, posing the problem that second harmonic strain of EGSM transmission is emitted from the antenna. The second harmonic emitted from this antenna is desirably −36 dBm or less.

There is also an example comprising a diplexer Dip1 for branching an EGSM receiving terminal (Rx) and a DCS transmission terminal (Tx), and a diplexer Dip2 for branching an EGSM transmission terminal (Tx) and a DCS receiving terminal (Rx), a switch circuit SW for switching Dip1 and Dip2 being similarly constituted by one GaAs switch. There is basically a problem that a GaAs switch is more likely to generate harmonic strain than a circuit comprising pin diodes. Power of +36 dBm at most may be supplied to a GaAs switch particularly in EGSM transmission. Accordingly, to suppress second harmonic generation to −36 dBm or less, an EGSM transmission signal generated from the GaAs switch per se should have second harmonic of −72 dBc or less. However, it is difficult at present to obtain GaAs switches with such small harmonic generation. Though the reduction of harmonic generation from the GaAs switch can be easily achieved by increasing supply voltage, increased supply voltage in parts used in mobile phones needs the increased supply voltage of batteries.

In the case of a circuit comprising a GaAs switch directly switching transmitting and receiving signals of plural frequencies without using a diplexer, the GaAs switch is more vulnerable to breakdown by electrostatic surge than a pin diode. To protect the GaAs switch from electrostatic surge, the inductor connected to a ground should be 5 nH or less. However, when the inductor of 5 nH or less is connected to an antenna top, it is difficult to obtain matching in a wide band from 900 MHz to 1.8 GHz. Because of this, too, the conventional electrostatic-surge-removing circuit cannot be used on an antenna top.

OBJECT OF THE INVENTION

Accordingly, an object of the present invention is to solve a problem (1) concerning the breakdown of high-frequency parts by electrostatic surge, a problem (2) concerning harmonic generation, and a problem (3) concerning miniaturization, power-saving and harmonic generation as described above, thereby providing an electrostatic-surge-removing highpass filter, a multiband antenna switch circuit with suppressed harmonic generation, particularly a multiband antenna switch circuit free from the problem of harmonic generation caused by using an FET switch for miniaturization and power saving, and a laminate module and communications device comprising such part.

DISCLOSURE OF THE INVENTION

The electrostatic-surge-removing highpass filter of the present invention comprises an input terminal, an output terminal, and a serial resonance circuit, the serial resonance circuit comprising a first inductor connected between the input terminal and a ground, a first capacitor connected between the input terminal and the output terminal, a second inductor connected to the output terminal, and a second capacitor connected to the second inductor and a ground.

The electrostatic-surge-removing highpass filter may comprise a parallel resonance circuit comprising a third inductor and a third capacitor between the second inductor and the output terminal.

The electrostatic-surge-removing highpass filter is preferably connected to at least an antenna top. This highpass filter may also be disposed between the receiving terminal of the switch circuit and the receiving SAW filter.

The multiband antenna switch circuit of the present invention comprises a diplexer connected to an antenna terminal for branching signals having different passbands; a first switch circuit for switching lower-frequency signals branched by the diplexer to plural transmitting/receiving terminals; a second switch circuit for switching higher-frequency signals branched by the diplexer to plural transmitting/receiving terminals; a first lowpass filter connected to a transmitting line between the diplexer and the transmission terminal or between the first switch circuit and the transmission terminal; a second lowpass filter connected to a transmitting line between the diplexer and the transmission terminal or between the second switch circuit and the transmission terminal; and a notch filter disposed between the diplexer and the first switch circuit and/or between the diplexer and the second switch circuit.

The multiband antenna switch circuit according to the first embodiment of the present invention comprises a diplexer connected to an antenna terminal for branching signals having different passbands; a first switch circuit for switching lower-frequency signals branched by the diplexer to a first transmission terminal and a first receiving terminal; a second switch circuit for switching higher-frequency signals branched by the diplexer to a second transmission terminal, a second receiving terminal and a third transmitting/receiving terminal; a first lowpass filter connected to a transmitting line between the diplexer and the first transmission terminal or between the first switch circuit and the first transmission terminal; and a second lowpass filter connected to a transmitting line between the diplexer and the second transmission terminal or between the second switch circuit and the second transmission terminal, the diplexer and the second switch circuit being connected to each other via a notch filter.

In the multiband antenna switch circuit in the above embodiment, a duplexer is preferably connected to the third transmitting/receiving terminal.

The multiband antenna switch circuit according to the second embodiment of the present invention comprises a diplexer for branching signals having different passbands; a first switch circuit for switching lower-frequency signals branched by the diplexer to plural transmitting/receiving terminals; a second switch circuit for switching higher-frequency signals branched by the diplexer to plural transmitting/receiving terminals; a first lowpass filter connected to a transmitting line between the diplexer and a transmission terminal or between the first switch circuit and the transmission terminal; and a second lowpass filter connected to a transmitting line between the diplexer and the transmission terminal or between the second switch circuit and the transmission terminal, wherein a notch filter is connected between the diplexer and the antenna terminal.

The multiband antenna switch circuit according to the third embodiment of the present invention comprises a diplexer for branching signals having different passbands; a first switch circuit for switching a lower-frequency signals branched by the diplexer to a first transmission terminal and a first receiving terminal; a second switch circuit for switching higher-frequency signals branched by the diplexer to a second transmission terminal, a second receiving terminal and a third transmitting/receiving terminal; a first lowpass filter connected to a transmitting line between the diplexer and the first transmission terminal or between the first switch circuit and the first transmission terminal; and a second lowpass filter connected to a transmitting line between the diplexer and the second transmission terminal or between the second switch circuit and the second transmission terminal, wherein a notch filter is connected between the diplexer and the antenna terminal.

In the multiband antenna switch circuit in the above embodiment, a duplexer is connected to the third transmitting/receiving terminal.

A preferred example of the above multiband antenna switch circuit has an input terminal and an output terminal; a highpass filter comprising a first inductor connected between the input terminal and the ground, a first capacitor connected between the input terminal and the output terminal, a second inductor connected to the output terminal, and a second capacitor connected to the second inductor and the ground being disposed at least between the diplexer and the antenna terminal.

A parallel resonance circuit comprising a third inductor and a third capacitor may be disposed between the second inductor of the highpass filter and the output terminal.

The multiband antenna switch circuit according to the fourth embodiment of the present invention comprises (a) a first diplexer comprising a first transmission terminal, a second receiving terminal and a first common terminal; (b) a second diplexer comprising a second transmission terminal, a first receiving terminal and a second common terminal; (c) a switch circuit comprising a first transmitting/receiving terminal, a second transmitting/receiving terminal and an antenna terminal for switching either one of the first transmitting/receiving terminal and the second transmitting/receiving terminal to the antenna terminal, and (d) a notch filter disposed between the switch circuit and the antenna terminal, the first common terminal being connected to the first transmitting/receiving terminal, and the second common terminal being connected to the second transmitting/receiving terminal.

The notch filter preferably comprises an inductor, a diode, a capacitor, a resistor and a power supply terminal, and its resonance frequency is adjustable by voltage applied to the power supply terminal.

The notch filter preferably comprises an inverse voltage terminal for applying inverse voltage to the diode.

The above multiband antenna switch circuit preferably comprises a highpass filter at least between the notch filter and the antenna terminal, the highpass filter comprising an input terminal, an output terminal, a first inductor connected between the input terminal and a ground, a first capacitor connected between the input terminal and the output terminal, a second inductor connected to the output terminal, and a second capacitor connected between the second inductor and the ground.

A parallel resonance circuit comprising a third inductor and a third capacitor is preferably disposed between the second inductor of the highpass filter and the output terminal.

The multiband antenna switch circuit of the present invention preferably comprises a first lowpass filter connected to the first transmission terminal, and a second lowpass filter connected to the second transmission terminal. The switch circuit is preferably formed by a GaAs semiconductor.

The composite laminate multiband antenna switch module of the present invention is constituted by an laminate comprising plural substrates, wherein part of transmission lines and capacitors constituting any one of the above-described multiband antenna switch circuits are formed on substrates in the laminate; and wherein switch elements, resistors, capacitors and inductors constituting part of the above multiband antenna-switch circuit are mounted onto the laminate as chip parts.

The communications device of the present invention comprises the above multiband antenna switch circuit or the above composite laminate multiband antenna switch module.

BRIEF DESCRIPTION OF THE DRAWINGS

FIG. 14($b$) is a view showing another example of a notch filter circuit;

BEST MODE FOR CARRYING OUT THE INVENTION

[1] Electrostatic-Surge-Removing Highpass Filter

Figure 1:
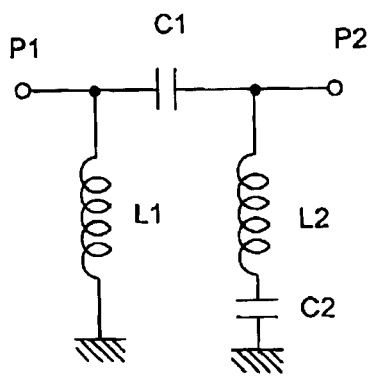
FIG. 1 is a circuit diagram showing an electrostatic-surge-removing highpass filter according to one embodiment of the present invention.

FIG. 1 shows one example of the electrostatic-surge-removing highpass filter circuit of the present invention. In FIG. 1, a first inductor L1 is connected between an input terminal P1 and a ground, a first capacitor C1 is disposed between the input terminal P1 and an output terminal P2, and a serial resonance circuit constituted by a second inductor L2 and a second capacitor C2 is connected between the output terminal P2 and a ground. Properly selected first inductor L1 and first capacitor C1 constitute a highpass filter releasing electrostatic surge to the ground while transmitting a high-frequency signal to pass through with low loss. It is desirable that the first inductor L1 is 50 nH or less, and that the first capacitor C1 is 10 pF or less, thereby releasing electrostatic surge of about 200 MHz or less to the ground.

A second inductor L2 and a second capacitor C2 are selected such that a serial resonance circuit comprising the second inductor L2 and the second capacitor C2 has a resonance frequency of 100 to 500 MHz. In this case, the second capacitor C2 is preferably 10 pF or more, and the second inductor L2 is preferably 50 nH or less. They can release electrostatic surge having a frequency close to the resonance frequency to the ground. The above structure can effectively remove electrostatic surge, because a surge effect in 200 MHz or less and that in about 100 MHz to 500 MHz are synthesized, thereby permitting electrostatic surge of about 500 MHz or less liable to electrostatic destruction to sufficiently release to the ground. In addition, the adjustment of parameters of the first inductor L1, the first capacitor C1, the second inductor L2 and the second capacitor C2 achieves matching in a broad bandwidth from 900 MHz to 1.8 GHz.

Figure 4:
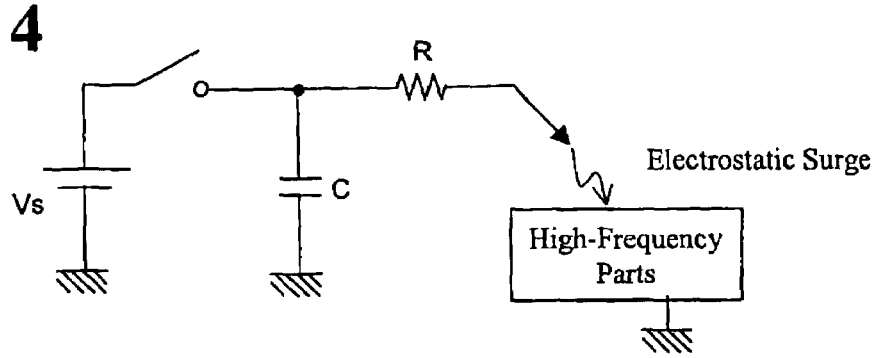
FIG. 4 is a view showing an equivalent circuit of a human body model test machine for reproducing electrostatic surge.

The breakdown of high-frequency parts due to electrostatic surge may occur when a charged human body contacts with an antenna of a mobile terminal. As a means for experimentally reproducing this situation, a human body model is generally used. Specifically, the charged condition of a human body is expressed by an equivalent circuit shown in FIG. 4, using an apparatus, in which charge stored in a capacitor C is discharged to a high-frequency part (object to be tested), via a resistor R.

Figure 5:
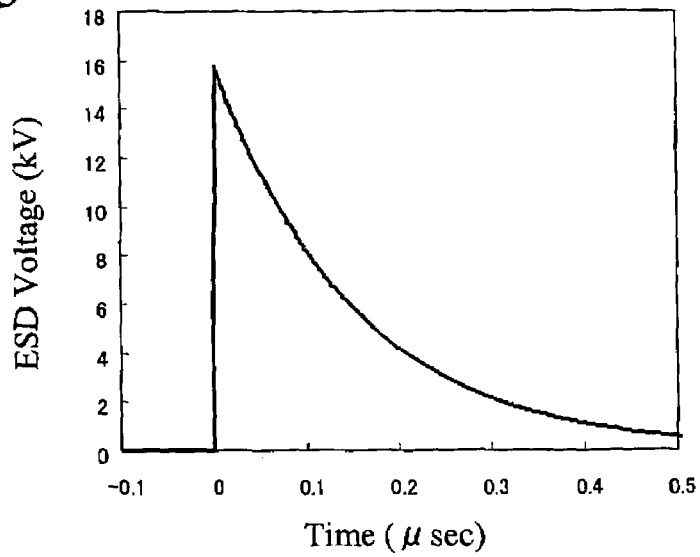
FIG. 5 is a graph showing an electrostatic surge voltage waveform.
Figure 6:
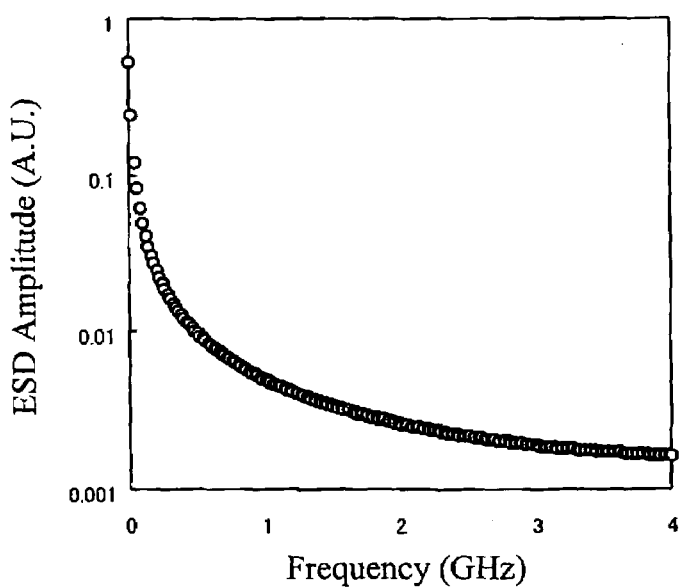
FIG. 6 is a graph showing frequency spectra of the electrostatic surge waveform.

In the human body model having a capacitor C of 150 pF and a resistor R of 330 Ω, a discharge surge waveform is as shown in FIG. 5. This discharge surge waveform is Fourier-transformed to obtain frequency components of the discharge surge waveform. The spectrum obtained is as shown in FIG. 6. It may be presumed from this frequency spectrum that a surge waveform from a human body is predominantly composed of frequency components from DC to 300 MHz, and that ideal as an electrostatic surge-removing part is a highpass filter capable of removing surge from DC to 300 MHz while permitting a high-frequency signal to pass through with low loss.

Figure 7:
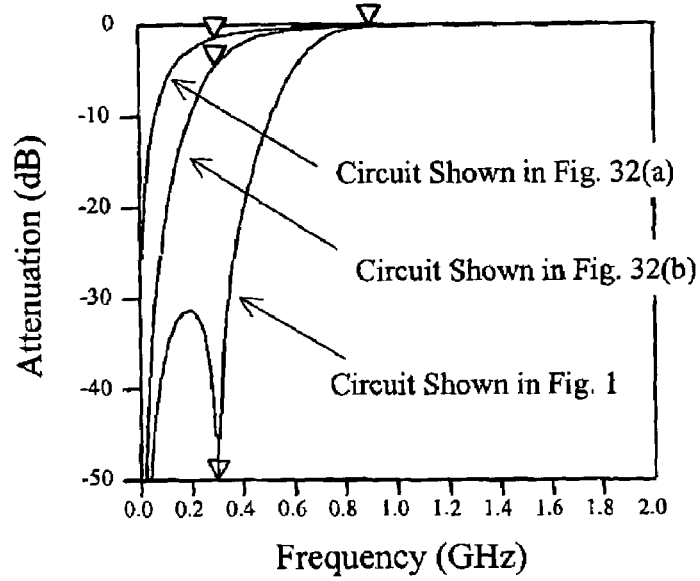
FIG. 7 is a graph showing the attenuation characteristics of a conventional electrostatic-surge-removing circuit and the electrostatic-surge-removing circuit of the present invention.
Figure 8:
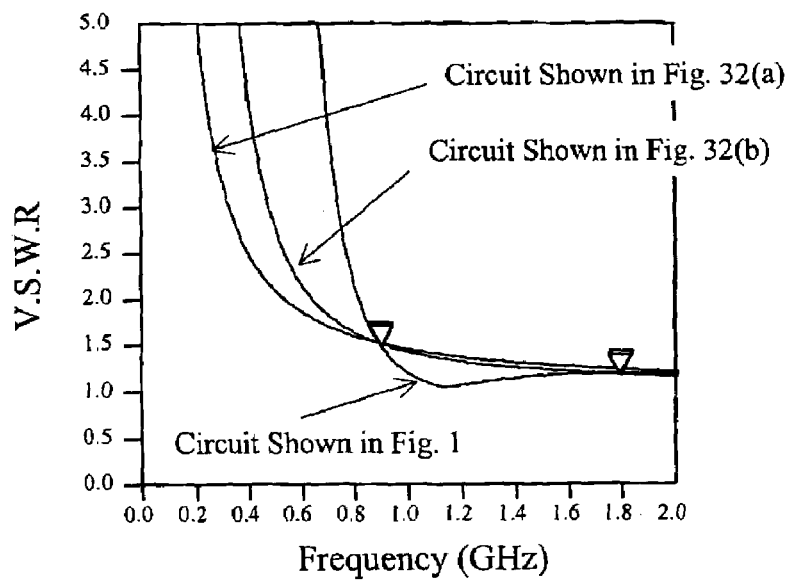
FIG. 8 is a graph showing the reflection characteristics of a conventional electrostatic-surge-removing circuit and the electrostatic-surge-removing circuit of the present invention.
Figure 32A:
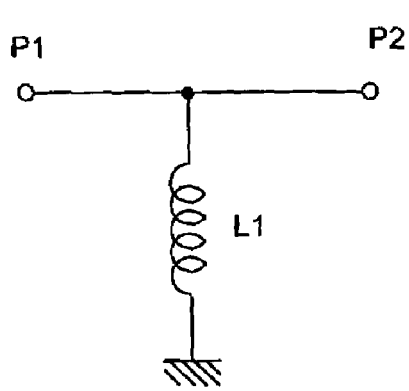
FIG. 32(a) is a view showing an equivalent circuit of one example of a conventional electrostatic-surge-removing circuit.
Figure 32B:
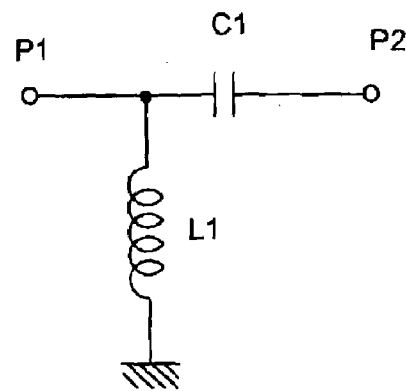
FIG. 32(b) is a view showing an equivalent circuit of another example of a conventional electrostatic-surge-removing circuit.

Thus, attenuation was measured in a range from DC to 2 GHz with respect to conventional electrostatic-surge-removing circuits shown in FIGS. 32(a) and 32(b), and the electrostatic-surge-removing circuit of the present invention shown in FIG. 1. FIG. 7 shows their attenuation characteristics, and FIG. 8 shows their reflection characteristics. With signals passing in 900-MHz and 1800-MHz bands to compare their attenuation characteristics, reflection characteristics V.S.W.R in these bands was set to be 1.5 or less as shown in FIG. 8. The resultant attenuation characteristics are, as shown in FIG. 7, the synthesis of attenuation characteristics of the first inductor L1 and the first capacitor C1 in about 200 MHz or less and attenuation characteristics of the second inductor L2 and the second capacitor C2 in a range from 100 MHz to 500 MHz, providing sufficient attenuation to a frequency band of 300 MHz or less, which is likely to cause electrostatic breakdown. Specifically, the attenuation is 5 dB or less in the electrostatic-surge-removing circuit shown in FIGS. 32(a) and 32(b), while it is 30 dB or more in the electrostatic-surge-removing circuit of the present invention, indicating that the electrostatic-surge-removing circuit of the present invention provides more attenuation by 25 dB or more. Namely, the present invention provides more attenuation of electrostatic surge voltage (electrostatic surge-removing effect) than the conventional technology by 25 dB or more (17 times or more).

Figure 2:
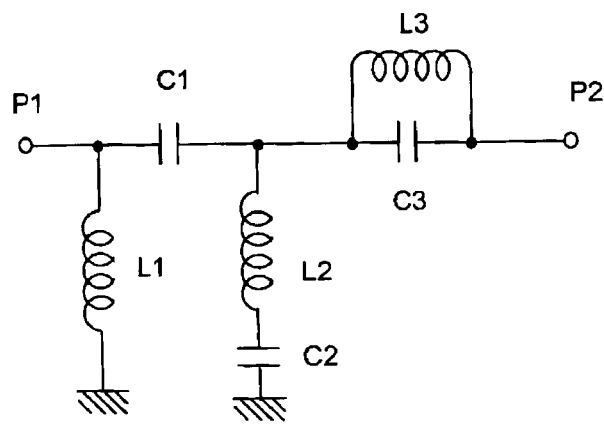
FIG. 2 is a circuit diagram showing an electrostatic-surge-removing highpass filter according to another embodiment of the present invention.

Another example of the electrostatic-surge-removing highpass filter circuit of the present invention is shown in FIG. 2. In FIG. 2, the first inductor L1, the second inductor L2, the first capacitor C1 and the second capacitor C2 have the same functions as above. The circuit shown in FIG. 2 is different from that shown in FIG. 1, in that a parallel resonance circuit constituted by a third capacitor C3 and a third inductor L3 is disposed between the first capacitor C1 and an output terminal P2. This parallel resonance circuit can function as a notch filter, which can remove harmonic noise signals generated from an antenna by having an attenuation peak at a frequency N times that of a pass signal (N is a natural number of 2 or more). In addition to the inductors L1, L2 and the capacitors C1, C2, the capacitor C3 and the inductor L3 also function as part of a matching circuit, increasing matching parts, thereby making matching in the entire circuit easier.

The above electrostatic-surge-removing highpass filter of the present invention can prevent the breakdown of high-frequency parts such as GaAs switches, pin diodes, etc. due to electrostatic surge.

EXAMPLE 1

Figure 3:
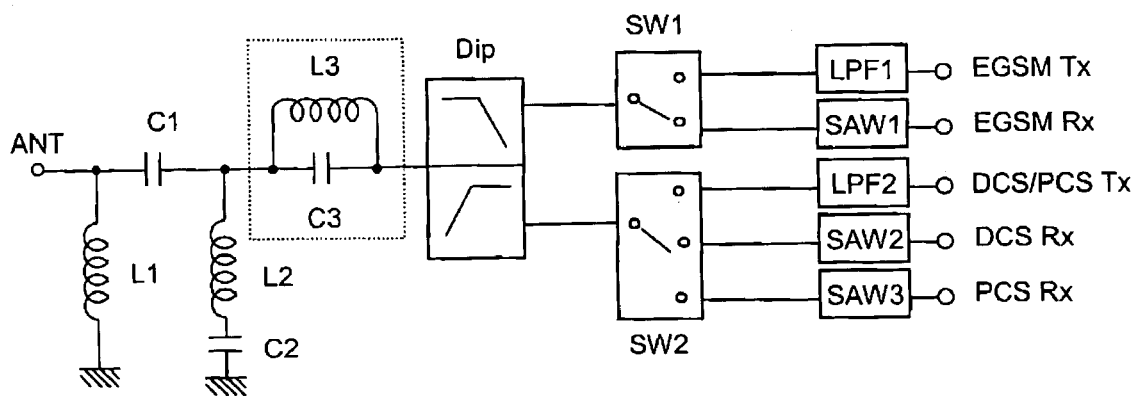
FIG. 3 is a block diagram showing one example of a multiband antenna switch circuit comprising the electrostatic-surge-removing highpass filter shown in FIG. 1.

FIG. 3 is a block diagram showing one example of a tripleband antenna switch circuit comprising the electrostatic-surge-removing highpass filter of the present invention. In this Example, the diplexer Dip causes branching to an EGSM-band signal (880 to 960 MHz) and a DCS/PCS-band signal (DCS: 1710 to 1880 MHz, PCS: 1850 to 1990 MHz). The switch circuit SW1 switches the transmitting and receiving of EGSM, and the switch circuit SW2 switches DCS/PCS transmission, DCS receiving and PCS receiving. The lowpass filter LPF1 attenuates an n-th harmonic strain contained in a transmission signal sent from the EGSM TX terminal, and the lowpass filter LPF2 attenuates an n-th harmonic strain contained in a transmission signal sent from the DCS/PCS TX terminal. The SAW filters SAW1, SAW2, SAW3 remove noises outside the receiving band from each receiving signal of EGSM, DCS and PCS.

The electrostatic-surge-removing circuit disposed between the antenna terminal ANT and the diplexer Dip causes electrostatic surge sent from the antenna terminal ANT to be absorbed to the ground. Accordingly, the switch circuit components including DIP diode switches, FET switches such as GaAs, etc., SAW filters for receiving signals, power amplifiers connected to transmission terminals and low-noise amplifiers connected to receiving terminals are protected from electrostatic surge.

A parallel resonance circuit comprising an inductor L3 and a capacitor C3 inside a dotted line in FIG. 3 is optionally added. With this parallel resonance circuit functioning as a notch filter having an attenuation peak adjusted at frequencies of 3420 MHz to 3820 MHz twice the DCS/PCS transmission frequencies, which includes frequencies of 3520 MHz to 3660 MHz four times the EGSM transmission frequency, frequencies twice the DCS/PCS transmission frequency and those four times the EGSM transmission frequency are attenuated simultaneously. Because the third inductor L3 and the third capacitor C3 also function as a matching circuit, it is useful for the entire antenna switch.

Other examples using the above electrostatic-surge-removing circuit will be explained later as examples of small, power-saving circuits using a harmonic generation-suppressing circuit, a GaAs switch, etc.

[2] Multiband Antenna Switch Circuit (A) Multiband Antenna Switch Circuit with Suppressed Harmonic Generation To suppress harmonic generation, a notch filter is disposed between the diplexer and the switch circuit or between the diplexer and the antenna terminal in the multiband antenna switch circuit of the present invention. This notch filter has an attenuation peak adjusted to a frequency of a harmonic transmission signal input to the transmission terminal of each switch circuit. When a transmission signal is a W-CDMA transmission signal at 1920 MHz to 1980 MHz, the attenuation peak of the notch filter is adjusted to a frequency two or three times the frequency of the W-CDMA transmission signal. Because this notch filter cuts off the harmonic strain generated in the switch circuit, the amount of harmonic waves emitted from the antenna is suppressed. Because the matching of the entire circuit may be different depending on the position of the inserted notch filter, a more suitable position for the matching of the entire circuit is preferably selected from between the diplexer and the switch circuit and between the diplexer and the antenna terminal.

Because a lowpass filter connected to a signal-transmitting line between the diplexer and the transmission terminal or between the switch circuit and the transmission terminal suppresses harmonics generated by the power amplifier for amplifying a transmission signal, the generation of harmonics is more suppressed in a line having both a notch filter and a lowpass filter.

A duplexer Dup comprises first and second transmitting/receiving terminals for the GSM and DCS systems, etc., and a third transmitting/receiving common terminal for the W-CDMA system, etc. and branches a transmission signal and a receiving signal to this transmitting/receiving common terminal by frequency difference between the signals. With the duplexer Dup and the switch circuit connected thereto, a multiband antenna switch circuit is adapted for the GSM systems such as GSM and DCS, and the W-CDMA system. Because the GSM system uses a TDMA (time division multiple access) system, and because the W-CDMA system uses a CDMA (code division multiple access) system, the multiband antenna switch circuit of the present invention is adapted for plural modes.

EXAMPLE 2

Figure 9:
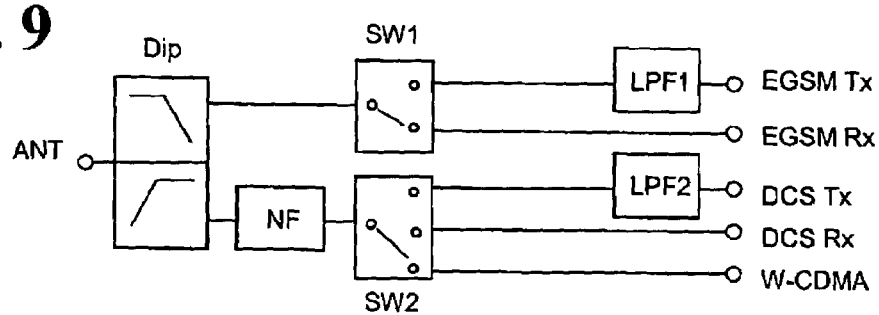
FIG. 9 is a block diagram showing an antenna switch circuit comprising a notch filter between a diplexer and a switch circuit according to one embodiment of the present invention, which is adapted for EGSM, DCS and W-CDMA.

FIG. 9 is a block diagram showing a tripleband antenna switch circuit adapted for EGSM, DCS and W-CDMA according to one embodiment of the present invention. Branched by the diplexer Dip are signals from the antenna in a band of 880 to 960 MHz for EGSM (transmission frequency: 880 to 915 MHz, receiving frequency: 925 to 960 MHz), and in a band of 1710 to 2170 MHz for DCS (transmission frequency: 1710 to 1785 MHz, receiving frequency: 1805 to 1880 MHz) and W-CDMA (transmission frequency: 1920 to 1980 MHz, receiving frequency: 2110 to 2170 MHz).

The switch circuit SW1 switches EGSM signals branched by the diplexer Dip to the transmission terminal EGSM Tx and the receiving terminal EGSM Rx. The switch circuit SW2 switches DCS or W-CDMA signals branched by the diplexer Dip to the transmission terminal DCS Tx, the receiving terminal DCS Rx and the transmitting/receiving terminal W-CDMA. To suppress n-th harmonic strain included in transmission signals sent from the power amplifier in the EGSM system, the first lowpass filter LPF1 comprises a filter permitting the EGSM transmission signal to pass through while sufficiently attenuating frequencies twice or more the EGSM transmission signal. Similarly, to suppress n-th harmonic strain included in transmission signals sent from the power amplifier in the DCS system, the second lowpass filter LPF2 comprises a filter permitting the DCS transmission signal to pass through while sufficiently attenuating frequencies twice or more the DCS transmission signal. Accordingly, harmonic strain generated by the power amplifiers is reduced by the first and second lowpass filters LPF1, LPF2.

The antenna switch circuit further comprises a notch filter NF having an attenuation peak at a frequency two or three times that of the W-CDMA transmission signal for reducing harmonic strain generated by the second high-frequency switch SW2, thereby reducing harmonics generated by the switch circuit. With these parts, harmonics emitted from the antenna ANT are reduced.

Figure 10:
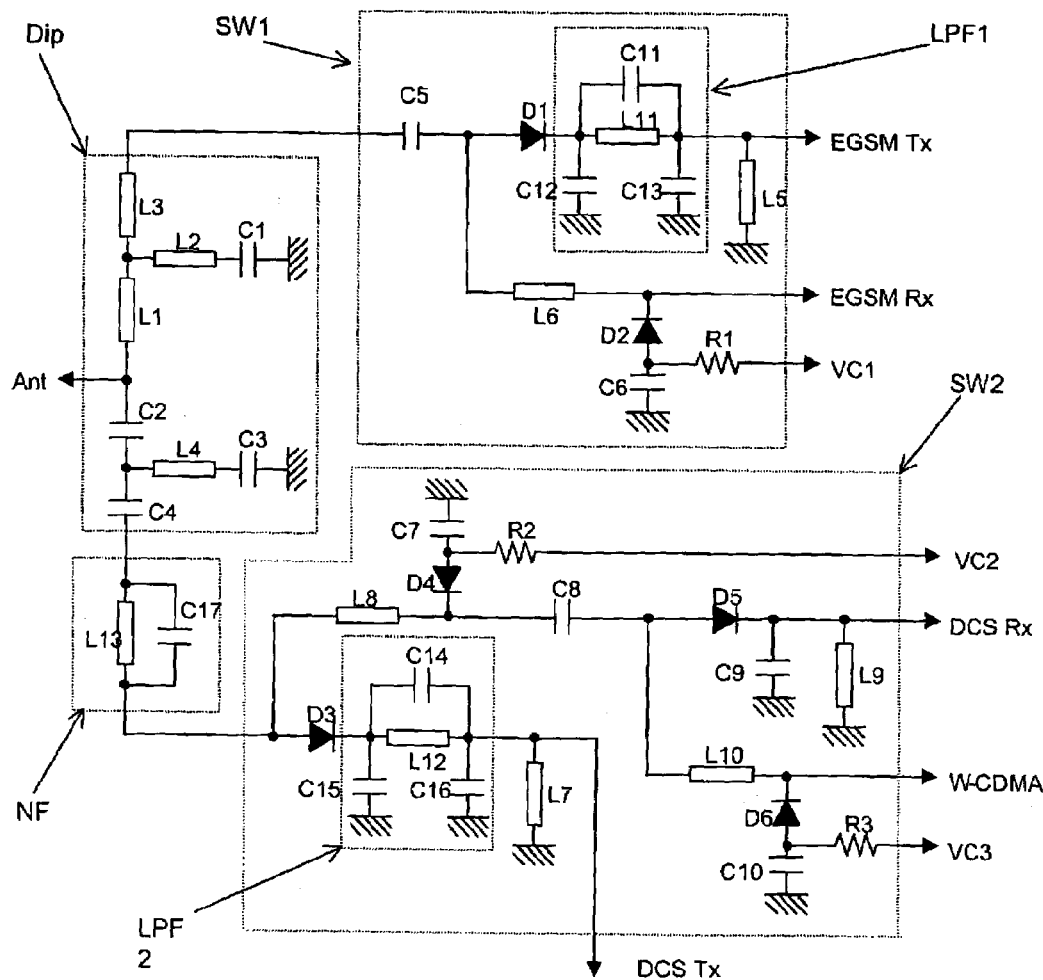
FIG. 10 is a view showing an equivalent circuit of the antenna switch circuit shown in FIG. 9.

An equivalent circuit according to this embodiment is exemplified in FIG. 10. The relation between the control voltage and each operation mode of EGSM, DCS and W-CDMA is shown in Table 1.

The diplexer Dip is constituted by transmission lines L1 to L4 and capacitors C1 to C4. A serial resonance circuit constituted by the transmission line L2 and the capacitor C1 is desirably designed to have a resonance frequency in DCS and W-CDMA bands, with an attenuation peak at 1.9 GHz. A serial resonance circuit constituted by the transmission line L4 and the capacitor C3 is desirably designed to have a resonance frequency in an EGSM band, with an attenuation peak at 0.9 GHz. This circuit can conduct the branching and synthesis of an EGSM signal, a DCS signal and a W-CDMA signal. The transmission lines L1, L3 preferably have such length that they have high impedance at frequencies of the DCS and W-CDMA signals, thereby making it difficult to transmit the DCS and W-CDMA signals to the EGSM line. On the other hand, the capacitors C2, C4 preferably have relatively small capacitance such that they have high impedance at a frequency of the EGSM signal, thereby making it difficult to transmit the EGSM signal to the DCS/W-CDMA line.

The first switch circuit SW1 is constituted by capacitors C5, C6, transmission lines L5, L6, pin diodes D1, D2, and a resistor R1. The transmission lines L5, L6 are set to have such length that they constitute a $\lambda/4$ resonator in a transmission frequency band of EGSM. The transmission line L5 may be substituted by a choke coil, whose ground level is substantially open (high impedance) at a frequency of EGSM transmission. In this case, the inductance is preferably about 10–100 nH. The resistor R1 determines electric current flowing through the first and second diodes D1, D2 when the control voltage VC1 is high. In this Example, the resistor R1 was 100 Ω to 200 Ω. The capacitors C5, C6 are necessary to cut a DC component in the control voltage. Because there is parasitic inductance due to connecting wires, etc. in the pin diode D2, when the control voltage VC1 is high, series resonance is caused to occur with the capacitor C6 to eliminate the parasitic inductance. The capacitance of the capacitor C6 may properly be set.

With the above structure, when the control voltage VC1 is high, both of the first and second diodes D1, D2 are turned on, while the connection point of the second diode D2 and the transmission line L6 is at a ground level, thereby making the impedance of the transmission line L6 ($\lambda/4$ resonator) on the opposite side infinitive. Accordingly, when the control voltage VC1 is high, a signal cannot pass through a line between the diplexer Dip and the EGSM receiving terminal EGSM Rx, while a signal, easily passes through a line between the diplexer Dip and the EGSM transmission terminal EGSM Tx. On the other hand, when the control voltage VC1 is low, the first diode D1 is also turned off, so that a signal cannot pass through a line between the diplexer Dip and the EGSM transmission terminal EGSM Tx. Because the second diode D2 is also turned off, a signal easily passes through a line between the diplexer Dip and the EGSM receiving terminal EGSM Rx. It is thus possible to switch the transmitting and receiving of the EGSM signal.

The second switch circuit SW2 is constituted by capacitors C7 to C10, transmission lines L7 to L10, pin diodes D3 to D6, and resistors R2, R3. The transmission lines L7 to L10 are set to have such length that they constitute a $\lambda/4$ resonator at a frequency of the DCS signal and a frequency of W-CDMA signal. The transmission lines L7, L9 may be replaced by a choke coil, whose ground level is substantially open (high impedance) at a transmission frequency of DCS and a transmission frequency of W-CDMA. In this case, the inductance is preferably about 5 to 60 nH.

The resistor R2 determines electric current flowing through the third and fourth diodes D3, D4, when the control voltage VC2 is high. In this Example, the resistor R2 was 100 Ω to 200 Ω. The resistor R3 determines electric current flowing through the fifth and sixth diodes D5, D6, when the control voltage VC3 is high. In this Example, the resistor R3 is 100 Ω to 2 kΩ. The capacitors C7, C8 and C10 are necessary for cutting the DC component in the control voltage. When the control voltage VC2 is high, there is parasitic inductance due to connecting wires, etc. in the pin diode D4. Accordingly, the capacitance of the capacitor C7 is set such that there is series resonance with the capacitor C7.

With the above structure, both of the third and fourth diodes D3, D4 are turned on, when the control voltage VC2 is high. Accordingly, the connection point of the fourth diode D4 and the transmission line L8 becomes a ground level, thereby making the impedance of the transmission line L8 ($\lambda/4$ resonator) on the opposite side infinitive. Accordingly, when the control voltage VC2 is high, a signal cannot pass through a line between the diplexer Dip and the DCS receiving terminal DCS Rx and a line between the diplexer Dip and the W-CDMA transmitting/receiving terminal W-CDMA, while a signal easily passes through a line between the diplexer Dip and the DCS transmission terminal DCS Tx. On the other hand, when the control terminal VC2 is low, the third diode D3 is also turned off, so that a signal cannot pass through a line between the diplexer Dip and the DCS transmission terminal DCS Tx. Because the fourth diode D4 is also turned off, a signal easily passes through a line between the diplexer Dip and the DCS receiving terminal DCS Rx and a line between the diplexer Dip and the W-CDMA transmitting/receiving terminal.

When the control terminal VC3 is high, because there is parasitic inductance due to connecting wires, etc. in the pin diode D6, the capacitance of the capacitor C10 is determined such that there is series resonance with the capacitor C10. Thus, when the control terminal VC3 is high, both of the fifth and sixth diodes D5, D6 are turned on, placing a connection point of the sixth diode D6 and the transmission line L10 on a ground level, resulting in infinitive impedance on the opposite side of the transmission line L10, a $\lambda/4$ resonator. Accordingly, when the control terminal VC3 is high, a signal cannot pass through a line between the diplexer Dip and the W-CDMA transmitting/receiving terminal, while a signal easily passes through a line between the diplexer Dip and the DCS receiving terminal DCS Rx. On the other hand, when the control terminal VC3 is low, both of the fifth and sixth diodes D5, D6 are turned off, so that a signal cannot pass through a line between the diplexer Dip and the DCS receiving terminal DCS Rx, and that a signal easily passes through a line between the diplexer Dip and the W-CDMA transmitting/receiving terminal W-CDMA.

With the above structure, when the control terminal VC2 is high, switching to DCS transmission terminal DCS Tx is achieved. When the control terminals VC2, VC3 are low and high, respectively, switching to DCS receiving terminal DCS Rx is possible. Also, when the control terminals VC2 and VC3 are low, switching to W-CDMA transmitting/receiving terminal W-CDMA is possible.

The first lowpass filter LPF1 is a π-type lowpass filter constituted by a transmission line L11 and capacitors C11 to C13. The transmission line L11 and the capacitor C11 constitutes a parallel resonance circuit with a resonance frequency set to be two or three times the transmission frequency of EGSM. In this Example, the resonance frequency was set at 2.7 GHz, which is three times the transmission frequency. With the above structure, harmonic strain can be removed from the transmission signal of EGSM supplied from the power amplifier.

Though the first lowpass filter LPF1 is disposed between the first diode D1 and the transmission line L5 in the first high-frequency switch SW1, it may be disposed between the diplexer Dip and first high-frequency switch SW1, or between the transmission line L5 and EGSM transmission terminal EGSM Tx. When the grounded capacitor of the first lowpass filter LPF1 is disposed in parallel with the transmission line L5, it constitutes a parallel resonance circuit, thereby making the transmission line L5 shorter than λ/4, and thus making the inductance of the choke coil smaller.

The second lowpass filter LPF2 is a π-type lowpass filter constituted by a transmission line L12 and capacitors C14 to C16. The transmission line L12 and the capacitor C14 constitute a parallel resonance circuit with a resonance frequency set to be two or three times the DCS transmission frequency. In this Example, the resonance frequency was set at 3.6 GHz, two times the transmission frequency. With the above structure, harmonic strain can be removed from the transmission signal of DCS supplied from the power amplifier.

Though the second lowpass filter LPF2 is disposed between the diplexer Dip and the second high-frequency switch SW2 like the first lowpass filter LPF1, it may be disposed between the transmission line L7 and the DCS transmission terminal DCS Tx. In this Example, the first and second lowpass filters LPF1, LPF2 are disposed between the diode D1 and the transmission line L5, and between the diode D3 and the transmission line L7, respectively, namely in the switch circuit. This is preferable in circuit designing, though not indispensable. The lowpass filter may be disposed at an arbitrary position in a signal-transmitting line for passing a transmission signal between the diplexer and the transmission terminal.

The notch filter NF connected between the diplexer Dip and the second switch circuit SW2 is constituted by a transmission line L13 and a capacitor C17. The transmission line L13 and the capacitor C17 constitute a parallel resonance circuit with a resonance frequency two or three times the transmission frequency of W-CDMA. In this Example, the resonance frequency was set at 3.9 GHz. Because the control voltages VC2 and VC3 are low in the W-CDMA mode, the diodes D3 to D6 in an OFF state are connected to the line of W-CDMA. Accordingly, when a high-power W-CDMA transmission signal is supplied, harmonic strain is generated by large nonlinearity of diodes. However, the notch filter NF connected between the diplexer Dip and the high-frequency switch SW2 removes harmonic strain, thereby suppressing harmonics from being generated by the antenna.

Figure 34:
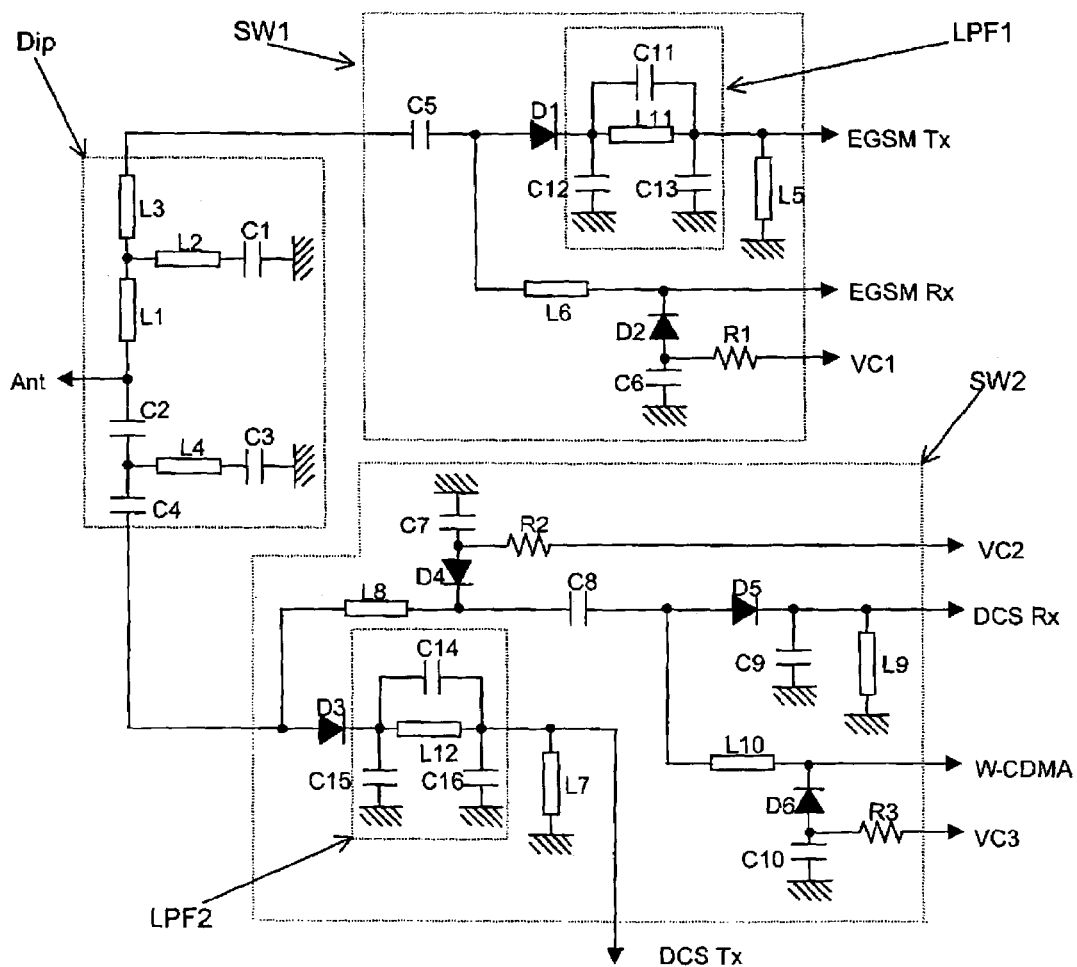
FIG. 34 is a view showing an equivalent circuit of a conventional antenna switch circuit adapted for EGSM, DCS and W-CDMA.

In addition, because the resonance frequency of the notch filter NF has an attenuation peak at 3.9 GHz, relatively close to 3.5 GHz, which is two times the transmission frequency of DCS, the generation of second harmonics of the transmission frequency of DCS is suppressed simultaneously. Table 2 shows characteristics of the conventional circuit shown in FIG. 34 and the circuit of the present invention shown in FIG. 10 for comparison. Harmonics are more suppressed in this Example by 15 dBc or more than in the conventional circuit at frequencies of both two and three times the transmission frequencies of DCS and W-CDMA.

TABLE 2

Comparison of characteristics between circuit of present invention and conventional circuit

| Mode | Generated Harmonics | Conventional Circuit (FIG. 34) | Circuit of Present Invention (FIG. 10) | Input Power |
|---|---|---|---|---|
| GSM | Second Harmonic | −85 dBc | −85 dBc | 37 dBm |
|  | Third Harmonic | −90 dBc or less | −90 dBc or less |  |
| DCS | Second Harmonic | −70 dBc | −85 dBc | 34 dBm |
|  | Third Harmonic | −85 dBc | −90 dBc or less |  |
| W-CDMA | Second Harmonic | −60 dBc | −80 dBc | 29 dBm |
|  | Third Harmonic | −75 dBc | −90 dBc or less |  |

Figure 14A:
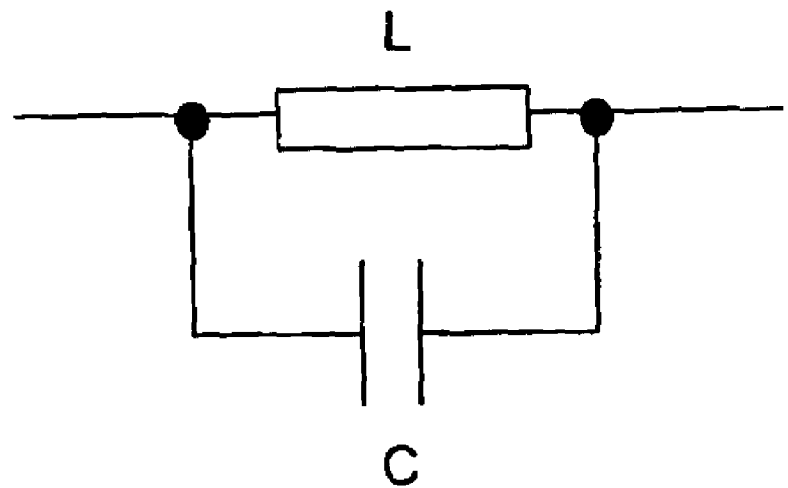
FIG. 14($a$) is a view showing one example of a notch filter circuit.
Figure 14B:
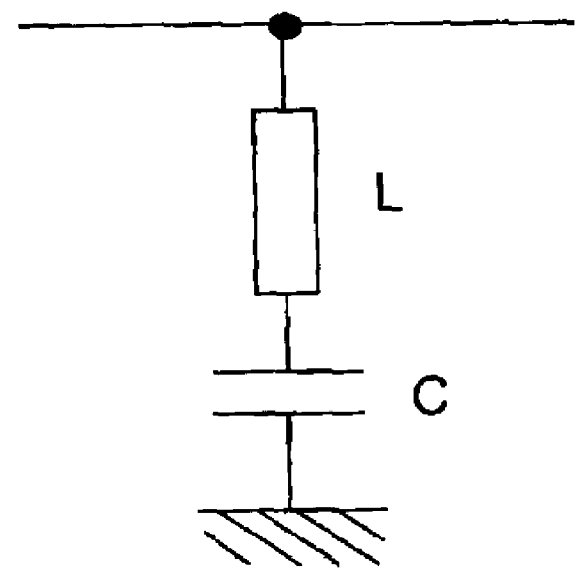

The notch filter NF shown in FIG. 9 can be made by a serial resonance circuit comprising a transmission line and a capacitor as shown in FIG. 14(b) as well as by a parallel resonance circuit comprising a transmission line and a capacitor as shown in FIG. 14(a). Though a parallel resonance circuit was applied in this Example for matching, the serial resonance circuit causes less deterioration in insertion loss due to resistance loss, because it does not have a transmission line added in series to the line, through which a passband signal passes.

EXAMPLE 3

Figure 11:
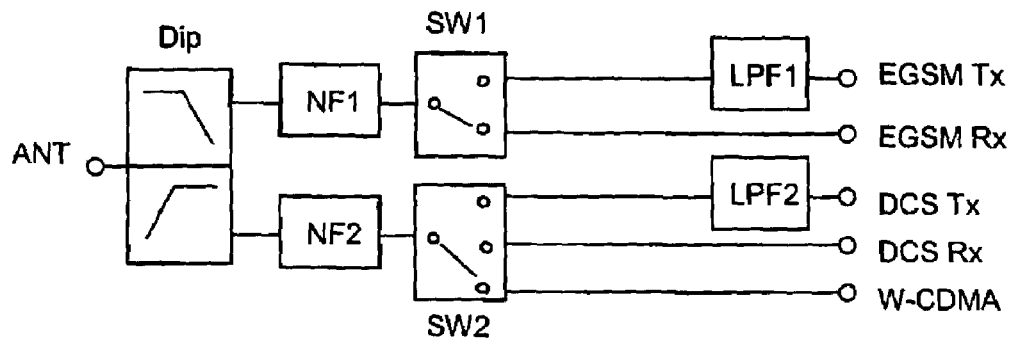
FIG. 11 is a block diagram showing an antenna switch circuit adapted for EGSM, DCS and W-CDMA according to another embodiment of the present invention.

FIG. 11 is a block diagram showing an antenna switch circuit adapted for EGSM, DCS and W-CDMA. The circuit of this Example is the circuit shown in FIG. 9, in which a first notch filter NF1 is disposed between the diplexer Dip and the first switch circuit SW1. The notch filter NF1 may comprise a parallel resonance circuit and/or a serial resonance circuit shown in FIGS. 14(a) and 14(b), respectively. In this case, the resonance frequency is preferably set to be two or three times the transmission frequency of EGSM. Because the notch filter NF1 removes harmonic strain generated at the first high-frequency switch SW1 in this Example, harmonics generated by the antenna is further suppressed.

EXAMPLE 4

Figure 12:
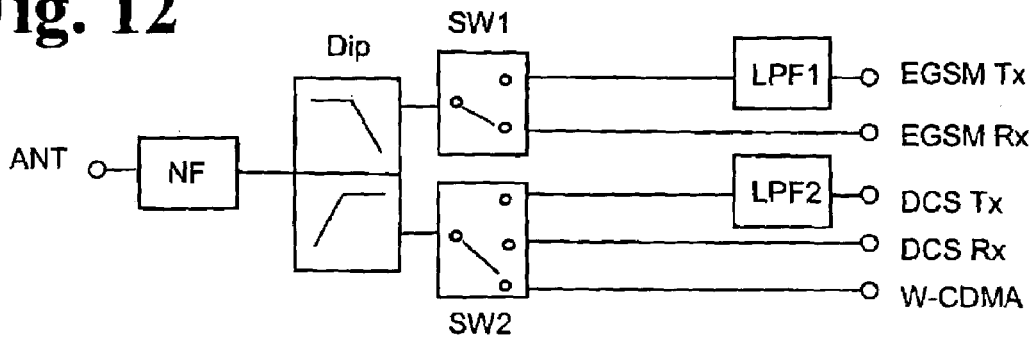
FIG. 12 is a block diagram showing an antenna switch circuit comprising a notch filter connected to an antenna and adapted for EGSM, DCS and W-CDMA according to a further embodiment of the present invention.

FIG. 12 is a block diagram showing an antenna switch circuit adapted for EGSM, DCS and W-CDMA with a notch filter NF disposed between the antenna terminal ANT and the diplexer Dip. Other than a switch circuit using a pin diode, a GaAs switch called SPDT (single pole dual throw) is usable as the first switch circuit SW1, and a GaAs switch called SP3T (single pole 3 throw) is usable as the second switch circuit SW2. The notch filter NF1 may be a parallel resonance circuit or a serial resonance circuit shown in FIGS. 14(a) and 14(b), respectively. In this case, the resonance frequency is preferably set to be two or three times the transmission frequency of W-CDMA.

Because the notch filter NF removes harmonic strain generated by the second high-frequency switch SW2 in this Example, the generation of harmonics by the antenna is suppressed. When the resonance frequency of the notch filter NF is 3.9 GHz, two times the W-CDMA transmission frequency, the attenuation peak can be relatively close to 3.6 GHz, two times the DCS transmission frequency, and 3.4

GHz, four times the EGSM transmission frequency. Accordingly, the antenna switch of this Example can suppress the generation of high-order harmonics such as a frequency of two times the W-CDMA transmission frequency, a frequency of two times the DCS transmission frequency, and a frequency of four times the EGSM transmission frequency.

The notch filter NF may be a variable notch filter comprising a variable capacitance such as a varactor diode, a pin diode, etc., whose attenuation peak can be controlled by an external signal as mentioned below. With this notch filter NF, the attenuation peak of the notch filter is adjustable to the most suitable frequency for each operation mode of EGSM, DCS and W-CDMA, resulting in harmonics suppressed to the minimum.

EXAMPLE 5

Figure 13:
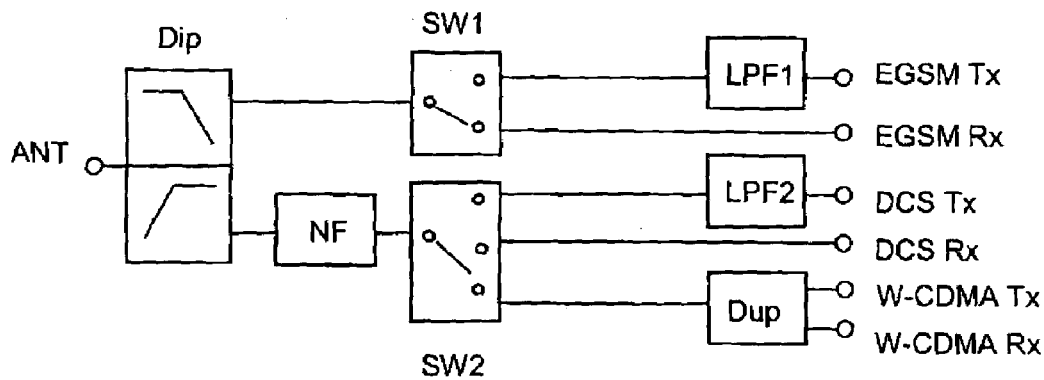
FIG. 13 is a block diagram showing an antenna switch circuit comprising a duplexer and adapted for EGSM, DCS and W-CDMA according to a still further embodiment of the present invention.

FIG. 13 is a block diagram showing an antenna switch circuit adapted for EGSM, DCS and W-CDMA. The circuit of this Example has a duplexer Dup for switching transmitting/receiving signals of W-CDMA to the W-CDMA transmitting/receiving terminals by frequency. In this Example, the duplexer Dup branches the transmitting/receiving signals in the W-CDMA band of 1920 MHz to 2170 MHz by the frequencies of transmitting/receiving signals, so that the transmitting and receiving of W-CDMA can be switched. That is, when SW2 is connected to the lowest W-CDMA, the switching of W-CDMA transmission and receiving can be conducted by Dup, and When the SW2 is in other connections the transmitting and receiving of EGSM or DCS are selected. This provides a multiband antenna switch circuit suitable for mobile phones adapted for different systems of TDMA and CDMA.

(B) Multiband Antenna Switch Circuit with Suppressed Harmonics at FET Switch

A switch circuit comprising a pin diode is generally advantageous in low production cost over an FET switch such as a GaAs switch, though it is unsuitable for miniaturization and electricity saving. On the other hand, the FET switch is more advantageously in a small size and less power consumption than the switch circuit comprising a pin diode. Another basic structure of the multiband antenna switch circuit of the present invention comprises two diplexers switched by one FET switch.

A first diplexer branches signals having different frequency bands to a first transmission terminal and a second receiving terminal, and a second diplexer branches signals in different frequency bands to a second transmission terminal and a first receiving terminal. A switch circuit switches connection between an antenna terminal and the above first diplexer, and connection between an antenna terminal and the above second diplexer. Accordingly, when the first transmission terminal and the antenna terminal are connected, the second transmission terminal is cut off by the above switch circuit, thereby solving a problem in the conventional technologies that harmonic strain output from the power amplifier reaches the antenna terminal in an OFF state. Similarly, when the second transmission terminal and the antenna terminal are connected, the first transmission terminal is cut off by the above switch circuit, thereby solving a problem in the conventional technologies that harmonic strain output from the power amplifier reaches the antenna terminal in an OFF state.

A first lowpass filter connected to a first transmission terminal passes only a transmission signal having a fundamental frequency among transmission signals supplied from the power amplifier to the first transmission terminal, thereby reducing high-order harmonic strain. Similarly, a second lowpass filter connected to a second transmission terminal passes only a transmission signal having a fundamental frequency among transmission signals supplied from a power amplifier to the second transmission terminal, thereby reducing high-order harmonic strain. A notch filter connected between the switch circuit and the antenna is adjusted to have an attenuation peak at a frequency of two or three times that of the transmission signal. Accordingly, the connection of these filters effectively reduces second or third harmonic strain generated by the above switch circuit.

The notch filter is constituted by an inductor, a diode switch, a capacitor, a resistor and a power supply terminal. The resonance frequency of the notch filter can be changed depending on voltage applied to the above power supply terminal. Accordingly, with an attenuation peak of the notch filter set at a frequency of second or third harmonic of the first transmission signal when the first transmission terminal is connected to the antenna terminal, and with the attenuation peak set at a frequency of second or third harmonic of the second transmission signal when the second transmission terminal is connected to the antenna terminal, the generation of harmonics in both bands is reduced simultaneously. When voltage is not applied to a diode switch constituting the notch filter, the notch filter itself generates harmonic strain. This is effectively avoided by providing an inverse voltage terminal for applying an inverse voltage to the above diode switch.

Because signals of low and high frequencies input to and output from the diplexer should pass through the above switch circuit with lower loss, a GaAs FET switch, etc. having a wide passband are used for the above switch. However, the GaAs FET switch is more vulnerable to the breakdown of high-frequency parts by electrostatic surge than the pin diode, etc. This can be overcome by disposing the above highpass filter between the switch circuit and the antenna to cause the ground to absorb electrostatic surge voltage.

As described above, even when the GaAs FET switch, etc. are used, it is possible to suppress the generation of harmonics at the power amplifier and the switch circuit, protect high-frequency parts from breakdown by electrostatic surge, reduce the size and cost of the antenna switch circuit, and reduce power consumption.

EXAMPLE 6

Figure 15:
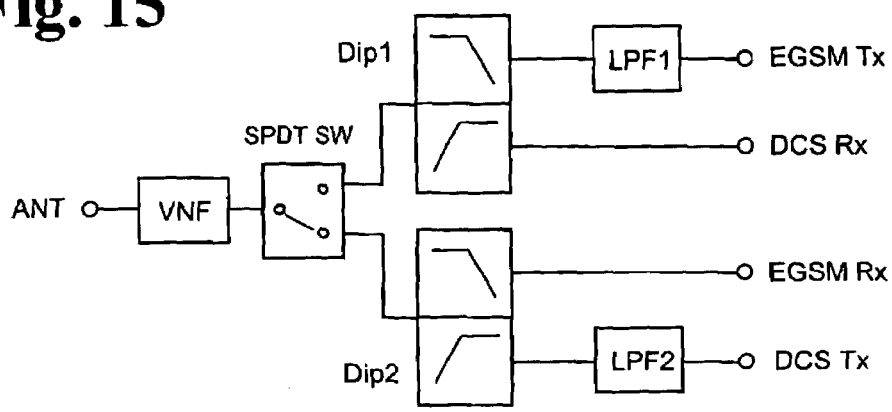
FIG. 15 is a block diagram showing an antenna switch circuit comprising an FET switch and a variable notch filter and adapted for EGSM and DCS according to one embodiment of the present invention.

FIG. 15 is a block diagram showing an antenna switch circuit adapted for EGSM and DCS according to one embodiment of the present invention. A first diplexer Dip1 branches and synthesizes an EGSM transmission signal (880 MHz to 915 MHz) and a DCS receiving signal (1805 MHz to 1880 MHz). A second diplexer Dip2 branches and synthesizes an EGSM receiving signal (925 MHz to 960 MHz) and a DCS transmission signal (1710 MHz to 1785 MHz). A switch circuit SW connected to the first and second diplexers Dip1, Dip2 switches connection between an antenna terminal ANT and the first diplexer Dip1, and connection between the antenna terminal ANT and the second diplexer Dip2.

Figure 35:
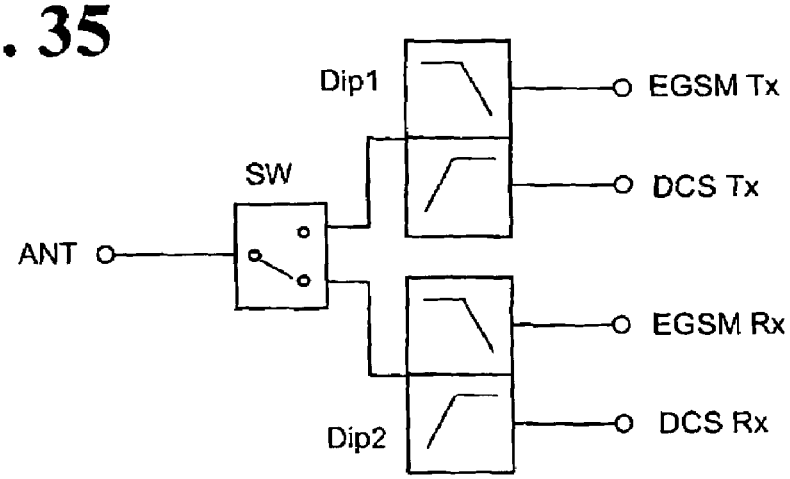
FIG. 35 is a block diagram showing a conventional antenna switch circuit branching and synthesizing EGSM and DCS by a diplexer and a switch circuit.
Figure 31:
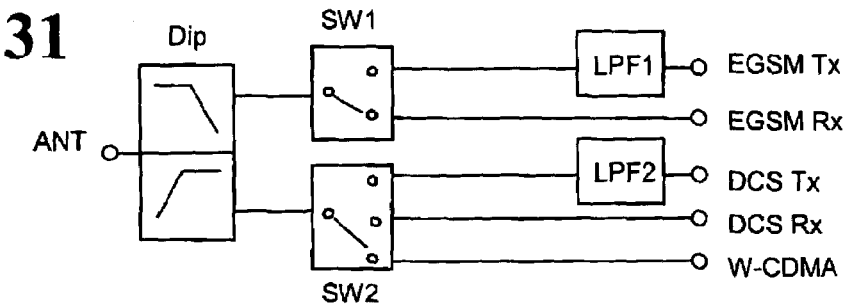
FIG. 31 is a block diagram showing a conventional antenna switch circuit adapted for EGSM, DCS and W-CDMA.

In this case, because the switch circuit should pass signals in the bands of EGSM and DCS with low loss, a GaAs FET switch, etc. called SPDT (single pole dual throw) having a wide passband are used. Accordingly, while there is connection between the ANT terminal and the first diplexer Dip1, and between the EGSM transmission terminal and the ANT terminal, the DCS transmission terminal is cut off by SPTD SW. In the EGSM transmission mode, though a power amplifier on the DCS side is not active, it slightly generates signals due to oscillation by the second harmonic of the EGSM transmission signal and crosstalk with an amplifier on the EGSM side. Thus, the second harmonic (1760 MHz to 1830 MHz) of the EGSM transmission signal generated by the power amplifier on the EGSM side is sent from the DCS transmission terminal and passes through the second diplexer Dip2 by crosstalk between power amplifiers of EGSM and DCS. However, because the switch SW cuts off the connection between the ANT terminal and the second diplexer Dip2, the second harmonic cannot reach the ANT terminal. Contrary to the above, because the DCS transmission terminal and the ANT terminal in the conventional technologies shown in FIG. 35 are connected to each other in the EGSM transmission mode, the second harmonic of the EGSM transmission signal disadvantageously reaches the ANT terminal.

As described above, the structure of the circuit of the present invention can reduce the generation of the second harmonic of the EGSM transmission signal in the EGSM transmission mode.

The first lowpass filter LPF1 comprises a filter permitting only the EGSM transmission signal to pass through while attenuating a frequency two or more times the EGSM transmission signal, thereby suppressing n-th harmonic strain contained in the EGSM transmission signal. Similarly, the second lowpass filter LPF2 comprises a filter permitting only the DCS transmission signal to pass through while attenuating a frequency two or more times the DCS transmission signal, thereby suppressing n-th harmonic strain contained in the DCS transmission signal. Because harmonic strain generated in the power amplifier is reduced by LPF1 and LPF2, the emission of harmonics from the antenna can be reduced.

To reduce the amount of harmonics generated in the GaAs FET switch, it is desirable that a variable notch filter VNF has attenuation peaks at a frequency of two or three times the EGSM transmission signal in the EGSM transmission mode and at a frequency of two or three times the DCS transmission signal in the DCS transmission mode. In this Example, a variable notch filter VNF, which changes a resonance frequency in each mode of EGSM and DCS as described above, was applied to reduce harmonic strain generated in the GaAs FET switch. A usual notch filter NF as well as the variable notch filter VNF may be used in the present invention.

Figure 16:
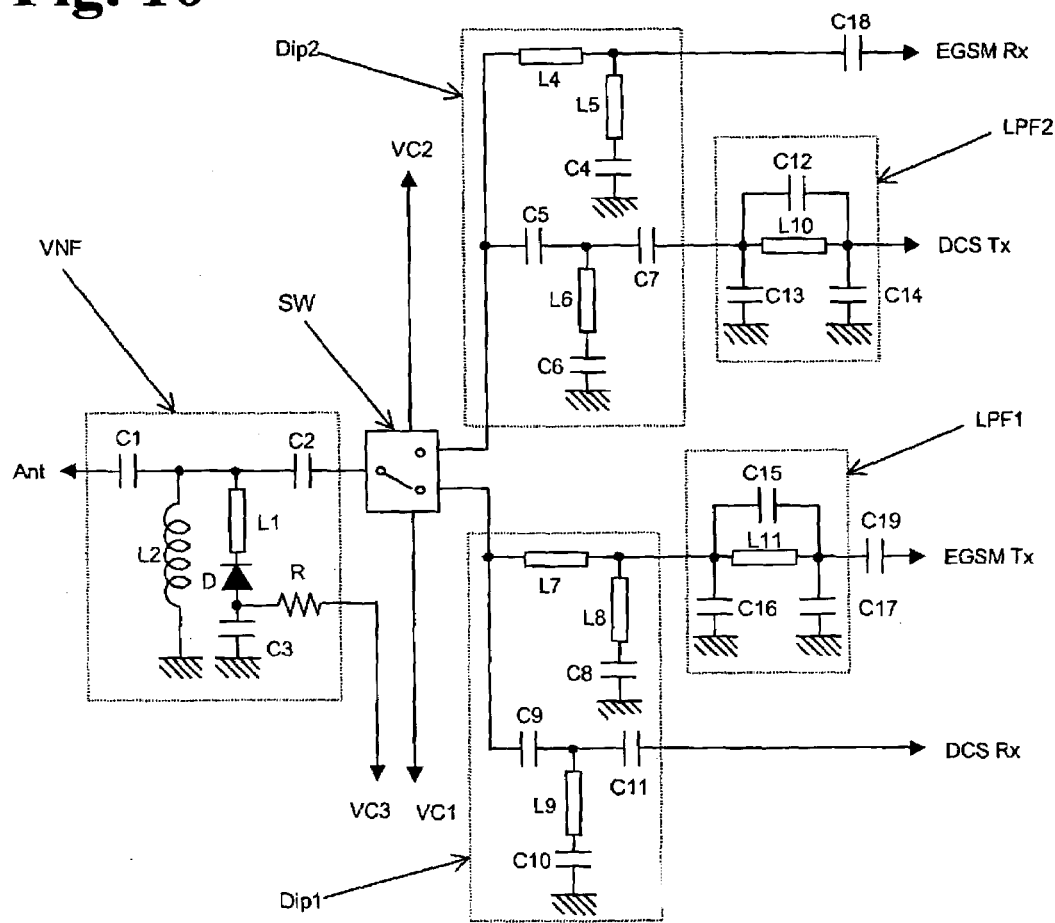
FIG. 16 is a view showing an equivalent circuit of the antenna switch circuit shown in FIG. 15.

FIG. 16 shows one example of a specific equivalent circuit of the circuit shown in FIG. 15. A diplexer Dip1 is constituted by transmission lines or inductors L7 to L9 and capacitors C8 to C11. L8 and C8 preferably constitute a serial resonance circuit designed to have a resonance frequency in the DCS receiving signal band. In this Example, the attenuation peak of the resonance frequency was set at 1.8 GHz. L9 and C10 preferably constitute a serial resonance circuit designed to have a resonance frequency in the EGSM transmission signal band. In this Example, the attenuation peak of the resonance frequency was set at 0.9 GHz. This circuit can branch and synthesize an EGSM transmission signal and a DCS receiving signal.

A diplexer Dip2 is constituted by transmission lines or inductors L4 to L6 and capacitors C4 to C7. L5 and C4 preferably constitute a serial resonance circuit designed to have a resonance frequency in the DCS transmission signal band. In this Example, the attenuation peak of the resonance frequency was set at 1.8 GHz. L6 and C6 preferably constitute a serial resonance circuit designed to have a resonance frequency in the EGSM receiving signal band. In this Example, the attenuation peak of the resonance frequency was set at 0.9 GHz. This circuit can branch and synthesize a DCS transmission signal and an EGSM receiving signal.

A lowpass filter LPF1 is constituted by a transmission line or inductor L11 and capacitors C15 to C17. L11 and C15 preferably constitute a parallel resonance circuit having a resonance frequency set at two or three times of the EGSM transmission frequency. In this Example, the resonance frequency was set at 2.7 GHz, three times the EGSM transmission frequency. This circuit can reduce the third harmonic of the EGSM transmission signal generated by the power amplifier.

A lowpass filter LPF2 is constituted by a transmission line or inductor L10 and capacitors C12 to C14. L10 and C12 preferably constitute a parallel resonance circuit having a resonance frequency set at two or three times of the DCS transmission frequency. In this Example, the resonance frequency was set at 3.6 GHz, two times the DCS transmission frequency. This circuit can reduce the second harmonic of the DCS transmission signal generated by the power amplifier.

Figure 17:
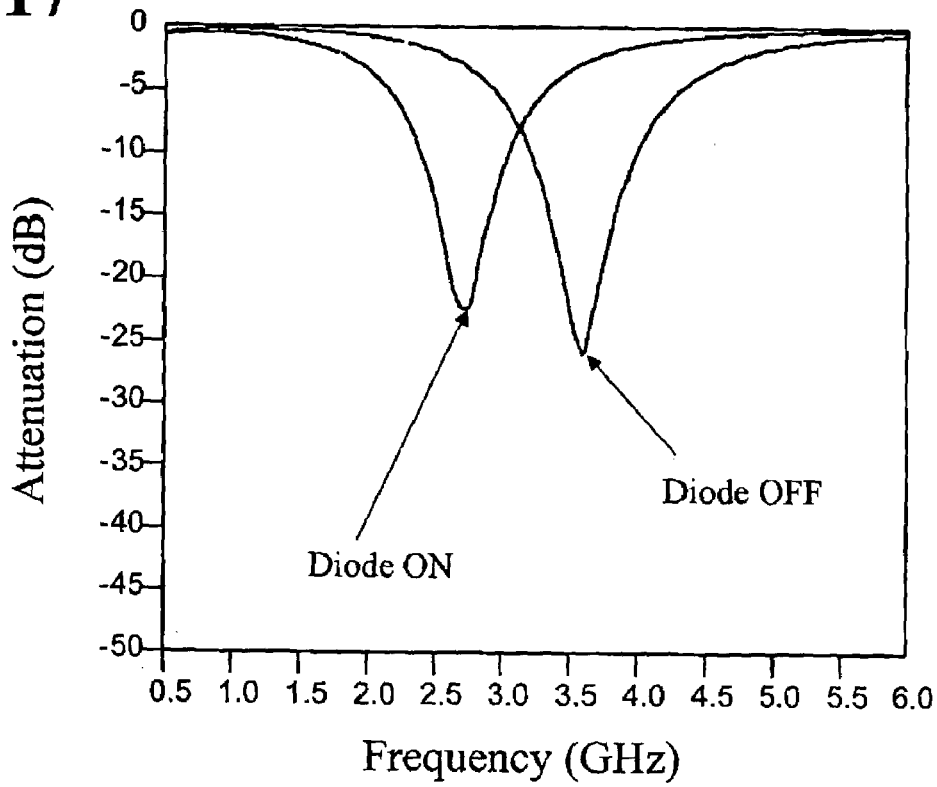
FIG. 17 is a graph showing the characteristics of the variable notch filter used in Example 6.

A variable notch filter VNF is constituted by a transmission line or inductor L1, a choke coil L2, capacitors C1 to C3, a diode switch D and a resistor R. L1, D and C3 constitute a serial resonance circuit having a resonance frequency variable with the ON/OFF state of the diode D. The diode is generally almost short-circuited in an ON state, while it has a capacitance of 0.1 to 1.0 pF in an OFF state. Accordingly, when the diode is turned on, L1 and C3 constitute a serial resonant circuit. On the other hand, when the diode is turned off, L1, C3 and the capacitance of the diode constitute a serial resonant circuit. The characteristics of VNF used in this Example are shown in FIG. 17.

VNF may have the following characteristics: When the diode is in an ON state, it has an attenuation peak at a frequency (about 2.7 GHz) three times that of the EGSM transmission signal. When the diode is in an OFF state, it has an attenuation peak at a frequency (about 3.6 GHz) two times that of the DCS transmission signal. The resonance frequency when the diode is in an ON or OFF state is arbitrarily adjustable by the combination of L1 and C3. To make the diode D turn on, voltage of about 0.7 V or more should be applied to let a direct current flow to the diode, and the choke coil L2 is needed for this purpose. L2 is preferably in a range of 20 nH to 100 nH to have large impedance to signals in the EGSM and DCS bands. In this Example, the impedance of L2 was set at 27 nH. The resistor R restricts current flown to the diode D. In this Example, the resistor R was set at 1 kΩ.

Because the choke coil L2 is disposed just downstream of the antenna and connected to the ground, electrostatic surge from outside is easily released to the ground by L2. Accordingly, the antenna switch circuit of the present invention has a function of protecting high-frequency parts less resistant to breakdown by electrostatic surge, such as SW circuits and parts connected downstream thereof, for instance, the SAW filters, the power amplifiers, the low-noise amplifiers, etc. To be more secure, however, it is preferable to use the above highpass filter circuit.

The switch circuit SW is connected to the first and second diplexers Dip1, Dip2 and the variable notch filter VNF. Accordingly, when VC1 is high, VNF is connected to Dip1 and disconnected from Dip2. On the other hand, when VC2 is high, VNF is connected to Dip2 and disconnected from Dip1. The capacitors C1, C2, C18, C19 are DC-cut capacitors necessary for switching the switch circuit SW and turning the diode D on or off.

Table 3 shows the relations between the operation mode and supply voltage in this embodiment. With respect to the supply voltage in Table 3, "High" is preferably +1 V to +5 V, and "Low" is preferably −0.5 V to +0.5 V.

TABLE 3

Relations between operation mode and supply voltage

| Mode | Supply Voltage | | | Attenuation |
| --- | --- | --- | --- | --- |
|  | VC1 | VC2 | VC3 | Peak of VNF |
| EGSM Tx | High | Low | High | 2.7 GHz |
| DCS Tx | Low | High | Low | 3.6 GHz |
| EGSM Rx | Low | High | Low | 3.6 GHz |
| DCS Rx | High | Low | Low | 3.6 GHz |

In the EGSM transmission mode, VC1 and VC3 are high while VC2 is low, and SW connects ANT to Dip1 while the line between ANT and Dip2 is open. Because the diode D is turned on, the resonance frequency of the notch filter VNF becomes about 2.7 GHz, three times the frequency of the EGSM transmission signal.

In the DCS transmission mode, VC2 is high while VC1 and VC3 are low, and SW connects ANT and Dip2 while the line between ANT and Dip1 is open. Because the diode D is turned off, the resonance frequency of the notch filter VNF becomes about 3.6 GHz, twice the frequency of the DCS transmission signal.

In the EGSM receiving mode, VC2 is ON while VC1 and VC3 are low, and SW connects ANT to Dip2 while the line between ANT and Dip1 is open. Because the diode D is turned off, the resonance frequency of the notch filter VNF becomes about 3.6 GHz.

In the DCS receiving mode, VC1 is ON while VC2 and VC3 are low, and SW connects ANT to Dip1 while the line between ANT and Dip2 is open. Because the diode D is turned off, the resonance frequency of the notch filter VNF becomes about 3.6 GHz.

The measurement results of suppressing effects of harmonics in this Example are shown in Table 4. The attenuation (dB) of second and third harmonics ($2f$, $3f$) was measured both in the circuit of this Example (FIG. 15) and in the circuit without a notch filter VNF and lowpass filters LPF1, LPF2 (FIG. 35). As is clear from these results, suppression effects of 20 dB or more were obtained by the circuit of the present invention. It is thus clear that the antenna switch circuit of the present invention can reduce the generation of harmonics at the power amplifier and the switch circuit.

TABLE 4

| Harmonics | Notch Filter | |
| --- | --- | --- |
|  | Yes (FIG. 15) | No (FIG. 35) |
| 2f | −75 dBc | −53 dBc |
| 3f | −80 dBc | −60 dBc |

EXAMPLE 7

Figure 18:
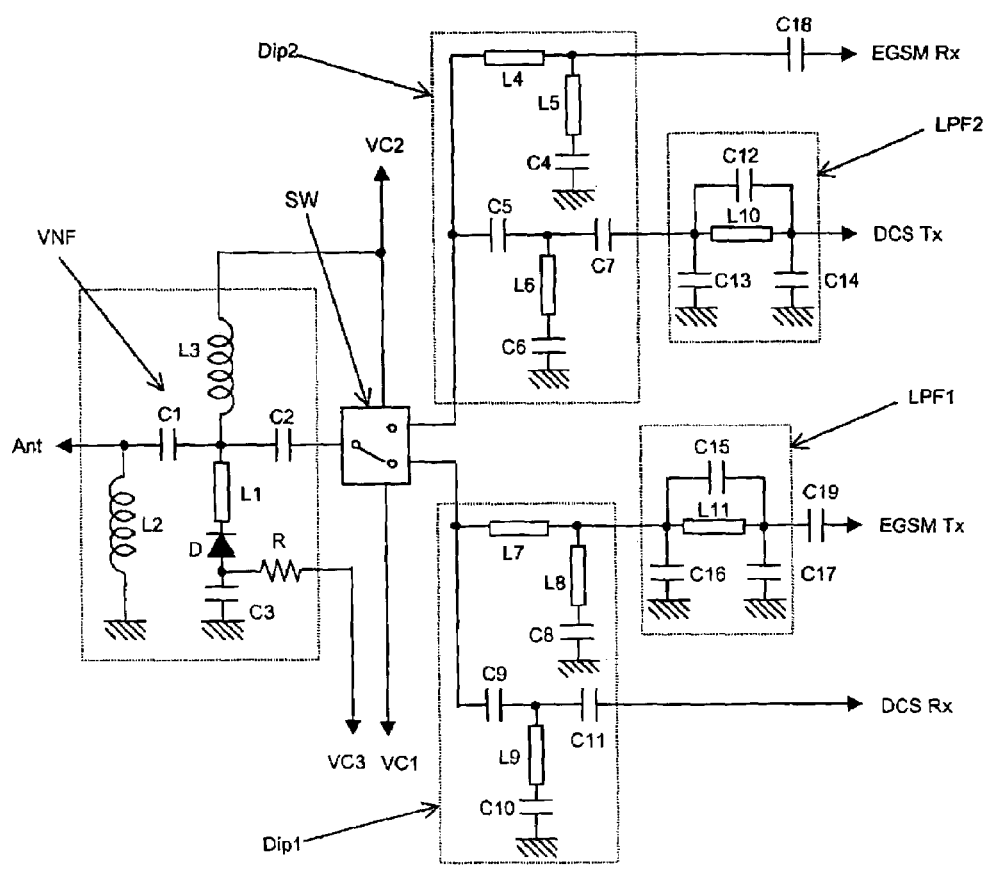
FIG. 18 is a view showing an equivalent circuit of the antenna switch circuit comprising an inverse voltage-applying variable notch filter and adapted for EGSM and DCS according to a still further embodiment of the present invention.

FIG. 18 shows an equivalent circuit of the antenna switch circuit adapted for EGSM and DCS according to another embodiment of the present invention. The equivalent circuit of this Example is the same as shown in FIG. 16 except for the variable notch filter VNF. VNF of this Example is constituted by a transmission line or inductor L1, choke coils L2, L3, capacitors C1 to C3, a diode switch D and a resistor R. L1, D and C3 constitute a serial resonance circuit, whose resonance frequency is changed by ON/OFF of the diode D. VNF used in this Example is characterized in that inverse voltage can be applied to the diode D.

Figure 19:
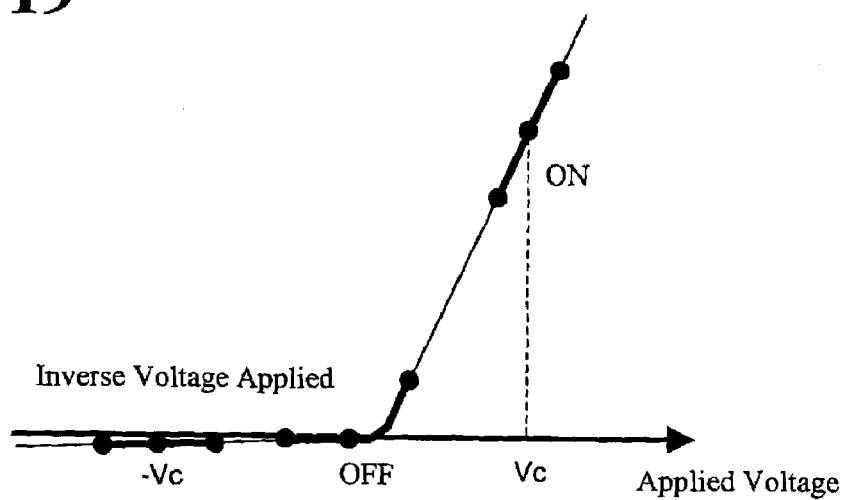
FIG. 19 is a graph showing an operating point of the pin diode.

It is generally known that when a high-power, high-frequency signal is input to a nonlinear device such as a diode, harmonic strain is generated. Particularly with a pin diode, harmonic strain generation in its OFF state is remarkable. As is clear from the V-I characteristics of the diode shown in FIG. 19, because the diode is driven at an operation point having relatively good linearity by the voltage Vc of the control voltage, the diode linearly responds to the voltage change due to high-frequency signals, resulting in less harmonic generation. On the other hand, because the operation point is around V=0 in an OFF state, the diode unlinearly responds to the voltage change due to high-frequency signals, resulting in large harmonic generation. The relation between the operation mode and the supply voltage is the same as shown in Table 3. Difference from Example 6 is that when VC2 is high and VC3 is low in the DCS transmission mode, inverse voltage is applied to the diode D. With inverse voltage applied to the diode, the diode linearly responds to voltage change due to high-frequency signals, resulting in less generation of harmonics at the notch filter. In the DCS transmission mode, VC2 is high while VC1 and VC3 are low, and SW connects ANT and Dip2 while connection between ANT and Dip1 is open. Though the diode D is turned off, inverse voltage applied affects the resonance frequency of the notch filter VNF. The impedance of the choke coil L3 to signals in the EGSM and DCS bands is preferably as large as 20 nH to 100 nH. In this Example, L3 having an impedance of 27 nH was used. The resistor R limits current flown to the diode D. In this Example, the resistor R was set at 1 kΩ. With the inductor L2 connected just downstream of ANT, high-frequency parts can be protected from electrostatic surge. The multiband antenna switch circuit having the above structure solves the problem in Example 6 that the generation of harmonics is increased when the diode D is in an OFF state.

EXAMPLE 8

Figure 20:
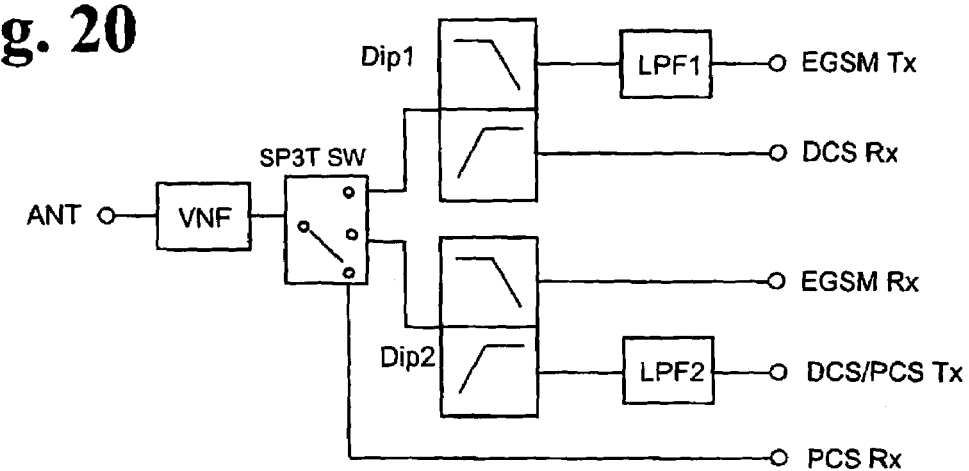
FIG. 20 is a block diagram showing an antenna switch circuit adapted for EGSM, DCS and PCS according to a still further embodiment of the present invention.

FIG. 20 is a block diagram showing a triple-band antenna switch circuit adapted for EGSM, DCS and PCS according to a further embodiment of the present invention. The antenna switch circuit of this Example comprises a PCS receiving terminal added to the antenna switch circuit in Example 6. The present invention relates to an antenna switch circuit having a basic structure comprising one FET switch such as a GaAs switch and two diplexers, and multiband antenna switch circuits comprising a plurality of other transmitting/receiving systems are also within the scope of the present invention as long as they have such basic structure. The same is true of Examples below.

In this Example, a GaAs FET switch called SP3T (single pole 3 throw) is used as a switch. Further, a circuit can be simplified by turning the DCS transmission terminal and the PCS transmission terminal to a common terminal. In this case, because the frequency (1710 MHz to 1785 MHz) of the DCS transmission and the frequency (1850 MHz to 1910 MHz) of the PCS transmission are relatively close to each other, it is possible to use a common power amplifier. Because other parts are the same as in the above Examples, the explanation of their details is omitted here. A tripleband antenna switch circuit adapted for EGSM, DCS and PCS is obtained by the antenna switch circuit of this Example.

EXAMPLE 9

Figure 21:
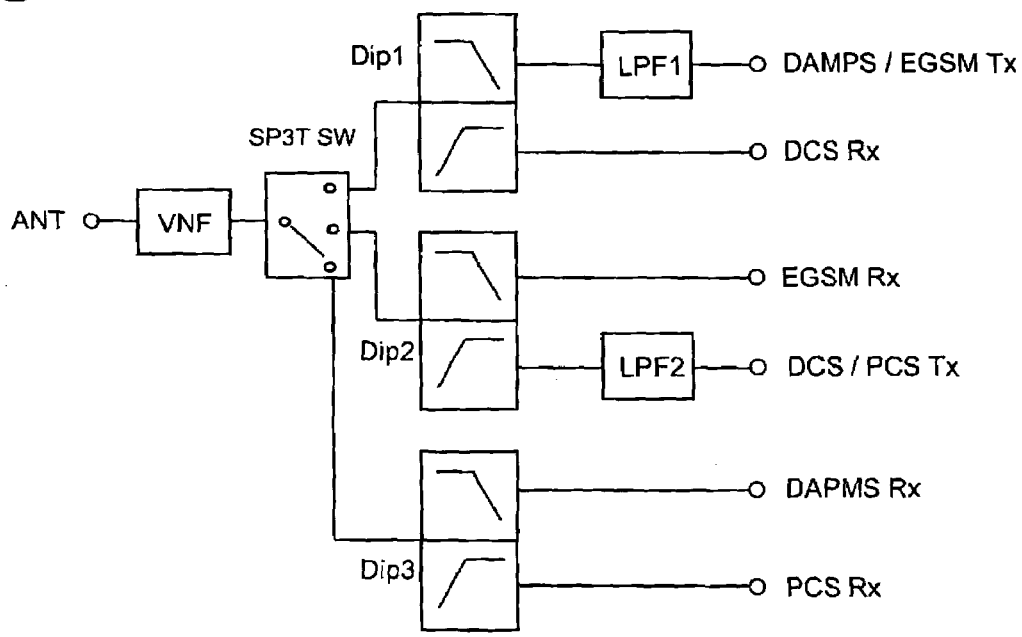
FIG. 21 is a block diagram showing an antenna switch circuit adapted for EGSM, DAMPS, DCS and PCS according to a still further embodiment of the present invention.

FIG. 21 is a block diagram showing a quad-band antenna switch circuit adapted for EGSM, DAMPS (transmission frequency: 824 to 849 MHz, receiving frequency: 869 to 894 MHz), DCS, and PCS according to a still further embodiment. The antenna switch circuit of this Example is the same as the antenna switch circuit in Example 8 except that a third diplexer Dip3 is connected thereto and a DAMPS receiving terminal is added thereto. A circuit can be simplified by turning the EGSM transmission terminal and the DAMPS transmission terminal to a common terminal. In this case, because the frequency (880 MHz to 915 MHz) of the EGSM transmission and the frequency (824 MHz to 849 MHz) of the DAMPS transmission are relatively close to each other, it is possible to use a common power amplifier. A quad-band antenna switch circuit adapted for EGSM, DAMPS, DCS and PCS is obtained in this Example.

EXAMPLE 10

Figure 22:
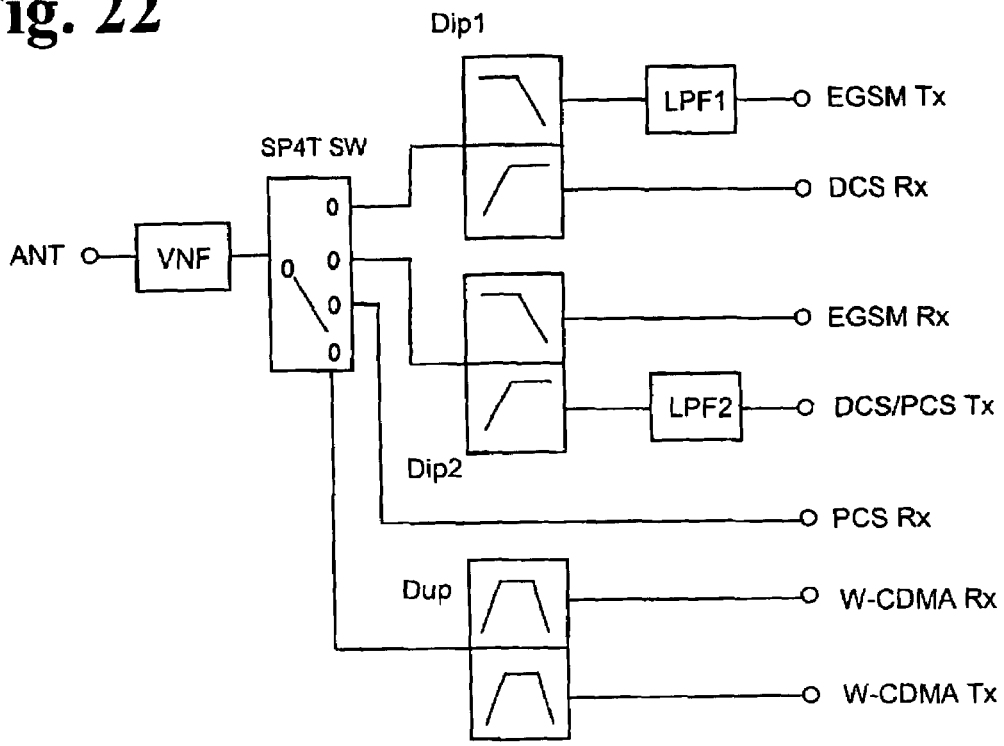
FIG. 22 is a block diagram showing an antenna switch circuit adapted for EGSM, W-CDMA, DCS and PCS according to a still further embodiment of the present invention.

FIG. 22 is a block diagram showing a quad-band antenna switch circuit adapted for EGSM, DCS, PCS and W-CDMA according to a still further embodiment. A GaAs FET switch called SP4T (single pole 4 throw) is used as a switch in this Example. A duplexer Dup is further connected downstream of a W-CDMA transmitting/receiving terminal. The duplexer Dup branches and synthesizes transmitting/receiving signals in the W-CDMA band (1920 MHz to 2170 MHz), and switches the transmission and receiving of W-CDMA. It is adapted for different systems of TDMA and CDMA, too. This Example provides a quad-band antenna switch circuit adapted for EGSM, DCS, PCS and W-CDMA.

EXAMPLE 11

Figure 23:
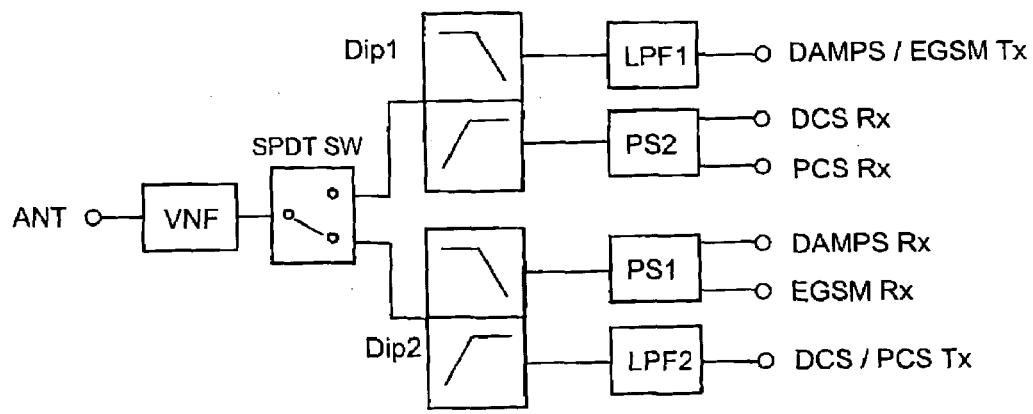
FIG. 23 is a block diagram showing an antenna switch circuit adapted for EGSM, DAMPS, DCS and PCS according to a still further embodiment of the present invention.
Figure 24:
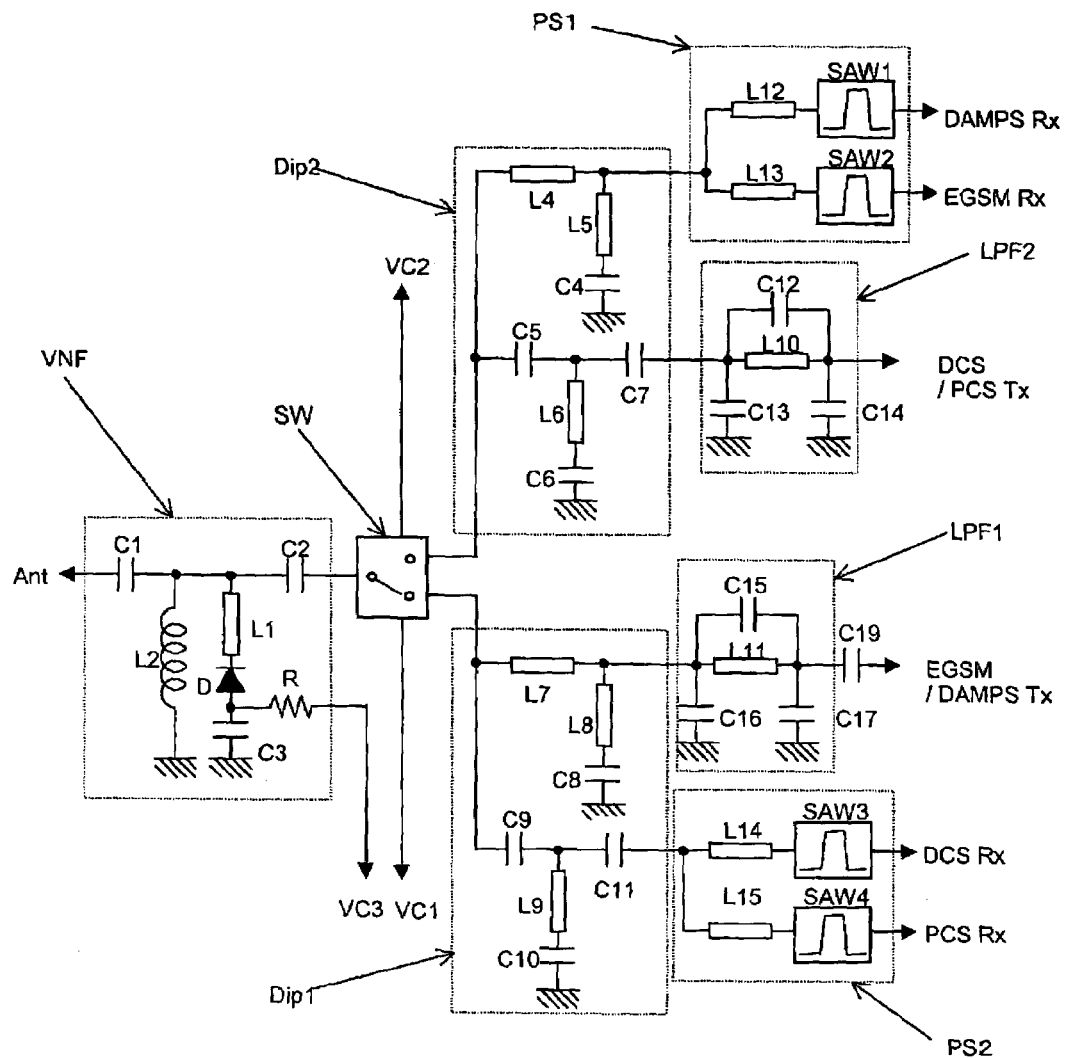
FIG. 24 is a view showing an equivalent circuit of the antenna switch circuit shown in FIG. 23.

Generally, GaAs switches are more expensive than diode switches. In addition, the SP3T-type GaAs switch used in Examples 8 and 9 and the SP4T-type GaAs switch used in Example 10 are unsuitable as parts used in mobile phones, because they are more expensive than the SPDT-type GaAs switch used in Examples 6 and 7. As their improvement, FIG. 23 shows a quad-band antenna switch circuit adapted for EGSM, DAMPS, DCS and PCS according to a still further embodiment of the present invention. The antenna switch circuit in this Example comprises phase shifters PS2 and PS1 connected to the first and second diplexers Dip1, Dip2, respectively, in the antenna switch circuit in Example 6. The use of SPDT as a GaAs switch in this Example makes parts less expensive than the use of SP3T or SP4T. FIG. 24 shows an equivalent circuit of this Example. Because Dip1, Dip2, SW, LPF1, LPF2 and VNF are the same as in Example 6, their explanation is omitted here.

The phase shifter PS1 is constituted by transmission lines L12, L13, a SAW filter SAW1 for DAMPS receiving signals and a SAW filter SAW2 for EGSM receiving signals. The transmission line L13 is a λ/4 resonator having a length adjusted to resonate with the DAMPS receiving frequency (869 MHz to 894 MHz). The transmission line L12 is a λ/4 resonator having a length adjusted to resonate with the EGSM receiving frequency (925 MHz to 960 MHz). The λ/4 resonator has such characteristics that its impedance drastically changes depending on termination conditions. Specifically, the impedance of the λ/4 resonator is 50 Ω at the termination of 50 Ω, open in the case of short-circuited termination, and short in the case of open termination. On the other hand, the SAW filter has impedance of 50 Ω in a passband, and nearly short at a frequency near the passband. Accordingly, in the DAMPS receiving band, the impedance of the EGSM receiving terminal is open, and the impedance of the DAMPS receiving terminal is 50 Ω, when viewed from the second diplexer Dip2, whereby the DAMPS receiving signal is branched to the DAMPS receiving terminal. On the contrary, in the EGSM receiving band, the impedance of the DAMPS receiving terminal is open, and the impedance of the EGSM receiving terminal is 50 Ω, when viewed from the second diplexer Dip2, whereby the EGSM receiving signal is branched to the EGSM receiving terminal. By the above operation, the first phase shifter PS1 can branch the DAMPS receiving signal and the EGSM receiving signal.

The second phase shifter PS2 is constituted by transmission lines L14, L15, a SAW filter SAW3 for DCS receiving signals and a SAW filter SAW4 for PCS receiving signals. The transmission line L15 is a λ/4 resonator having a length adjusted to resonate with the DCS receiving frequency (1805 MHz to 1880 MHz). The transmission line L14 is a λ/4 resonator having a length adjusted to resonate with the PCS receiving frequency (1930 MHz to 1990 MHz). The λ/4 resonator has such characteristics that its impedance greatly changes depending on termination conditions. The impedance of the λ/4 resonator is 50 Ω at the termination of 50 Ω, open in the case of short-circuited termination, and short in the case of open termination. On the other hand, the impedance of the SAW filter is 50 Ω in a passband, and nearly short at a frequency near the passband. Accordingly, in the DCS receiving band, the impedance of the PCS receiving terminal is open, and the impedance of the DCS receiving terminal is 50 Ω, when viewed from the diplexer Dip1, whereby the DCS receiving signal is branched to the DCS receiving terminal. On the other hand, in the PCS receiving band, the impedance of the DCS receiving terminal is open, and the impedance of the PCS receiving terminal is 50 Ω, when viewed from the diplexer Dip1, whereby the PCS receiving signal is branched to the PCS receiving terminal. By the above operation, PS2 can branch the DCS receiving signal and the PCS receiving signal.

Further, turning the EGSM transmission terminal and the DAMPS transmission terminal to a common terminal, the circuit can be simplified. In this case, because the EGSM transmission frequency (880 MHz to 915 MHz) and the DAMPS transmission frequency (824 MHz to 849 MHz) are relatively close to each other, a common power amplifier can be used. Similarly, by turning the DCS transmission terminal and the PCS transmission terminal to a common terminal, the circuit can be simplified. In this case, because the DCS transmission frequency (1710 MHz to 1785 MHz) and the PCS transmission frequency (1850 MHz to 1910 MHz) are relatively close to each other, a common power amplifier can also be used.

In the above embodiment, the use of only one GaAs switch of SPDT provides a quad-band antenna switch circuit adapted for EGSM, DAMPS, DCS and PCS, resulting in miniaturization and cost reduction.

(C) Multiband Antenna Switch Circuit Comprising Circuit for Removing Electrostatic Surge In the multiband antenna switch circuits comprising a switch circuit comprising the above-described pin diode and a switch circuit comprising a GaAs FET switch, of course, measures for electrostatic surge are preferably taken. Its example will be explained below.

EXAMPLE 12

Figure 25:
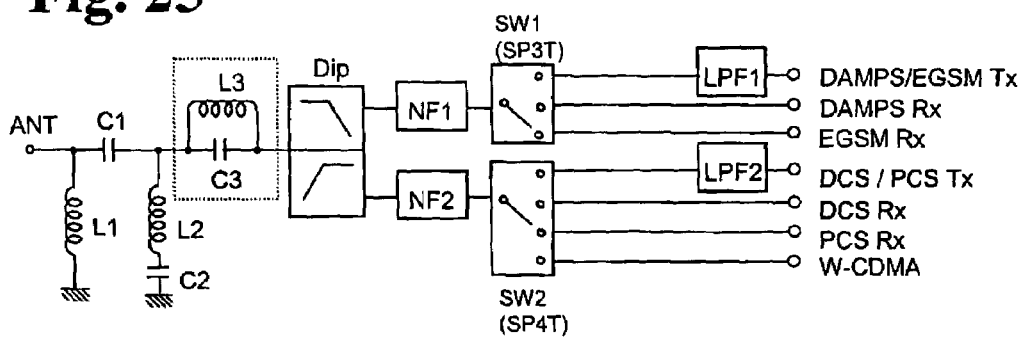
FIG. 25 is a block diagram showing an antenna switch circuit comprising an electrostatic-surge-removing circuit and adapted for EGSM, DAMPS, DCS, PCS and W-CDMA according to one embodiment of the present invention.

FIG. 25 is a block diagram showing an antenna switch circuit adapted for EGSM, DAMPS, DCS, PCS and W-CDMA according to one embodiment of the present invention. A first switch circuit SW1 conducts switching to an EGSM/DAMPS transmission terminal, an EGSM receiving terminal, and a DAMPS receiving terminal. A second switch circuit SW2 conducts switching to a DCS/PCS transmission terminal, a DCS receiving terminal, a PCS receiving terminal, and a W-CDMA transmitting/receiving terminal. A notch filter NF2 is preferably set at a frequency two or three times those of the DCS, PCS and W-CDMA signals. Used in this Example is a notch filter NF having an attenuation peak at 3.7 GHz as a two-times frequency. This filter attenuates harmonics generated from the antenna simultaneously in three transmission modes of DCS, PCS and W-CDMA. The notch filter NF1 is preferably set at a frequency two or three times those of EGSM and DAMPS transmission signals. Used in this Example is a notch filter NF having an attenuation peak at 1.7 GHz as a two-times frequency. Though the switches SW1, SW2 may be those comprising pin diodes, the GaAs switches of SP3T and SP4T were used as SW1 and SW2, respectively, in this Example.

An electrostatic-surge-removing circuit is disposed between the antenna terminal ANT and the diplexer Dip, so that the electrostatic surge is absorbed to the ground. A parallel resonance circuit constituted by the third inductor L3 and the capacitor C3 shown in the dotted line is optionally added. When this parallel resonance circuit is disposed, the attenuation peak is adjusted to a frequency of 3420 MHz to 3820 MHz, two times the DCS/PCS transmission frequency, so that a frequency of 3520 MHz to 3660 MHz, 4 times the EGSM transmission frequency, and a frequency of 3296 MHz to 3396 MHz, 4 times the DAMPS transmission frequency, are substantially simultaneously attenuated. Accordingly, the second harmonic of the DCS/PCS transmission frequency and the 4-th harmonic of the EGSM/DAMPS transmission signal can be simultaneously attenuated.

EXAMPLE 13

Figure 26:
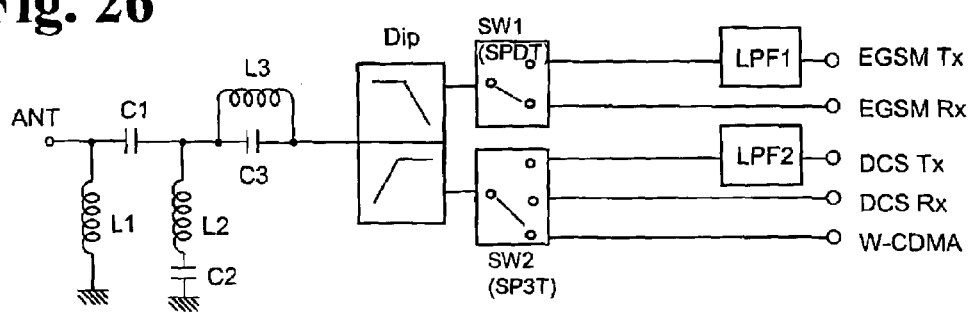
FIG. 26 is a block diagram showing an antenna switch circuit adapted for EGSM, DCS and W-CDMA according to a still further embodiment of the present invention.

FIG. 26 shows an electrostatic-surge-removing circuit disposed in a antenna switch circuit adapted for EGSM, DCS and W-CDMA according to a still further embodiment of the present invention. In this embodiment, a parallel resonance circuit constituted by a third inductor L3 and a capacitor C3 has a resonance frequency set at a frequency of 3.9 GHz, two times the W-CDMA transmission frequency, and this parallel resonance circuit is used as a notch filter NF. Accordingly, it reduces electrostatic surge having a frequency of 500 MHz or less by a circuit comprising a first inductor L1, a capacitor C1, a second inductor L2 and a capacitor C2, whereby a parallel resonance circuit comprising the third inductor L3 and the capacitor C3 has a function as a GHz-band notch filter.

EXAMPLE 14

Figure 27:
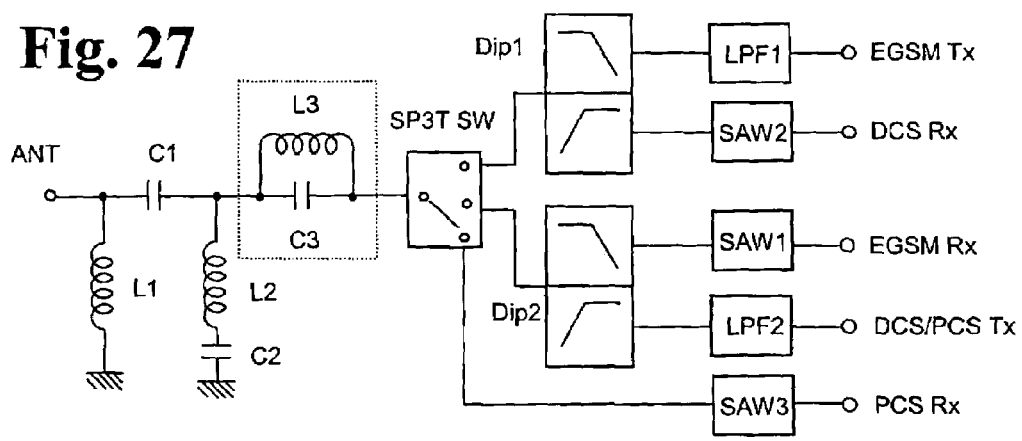
FIG. 27 is a block diagram showing an antenna switch circuit adapted for EGSM, DCS and PCS according to a still further embodiment of the present invention.

FIG. 27 shows an electrostatic-surge-removing circuit disposed in an antenna switch circuit adapted for EGSM, DCS and PCS according to a still further embodiment of the present invention. Using the SP3T switch, among signals input to and output from the antenna terminal, an EGSM transmission signal and a DCS receiving signal are switched to the diplexer Dip1, a DCS/PCS transmission signal and an EGSM receiving signal are switched to the diplexer Dip2, and a PCS receiving signal is switched to the PCS-receiving SAW3. The first lowpass filter LPF1 has a function of attenuating the n-th harmonic strain contained in a transmission signal supplied from the EGSM TX terminal, and the second lowpass filter LPF2 has a function of attenuating the n-th harmonic strain contained in a transmission signal supplied from the DCS/PCS TX terminal. The SAW filters SAW1, SAW2, SAW3 have a function of removing noises outside receiving bands from the EGSM receiving signal, the DCS receiving signal and the PCS receiving signal, respectively. The diplexer Dip1 is connected to LPF1 and SAW2, and the diplexer Dip2 is connected to LPF2 and SAW1.

The electrostatic-surge-removing circuit is disposed between the antenna terminal ANT and the SP3T switch, so that electrostatic surge sent from the antenna is absorbed to the ground. A parallel resonance circuit constituted by the third inductor L3 and the third capacitor C3 shown in the dotted line is optional. When this parallel resonance circuit is disposed, by adjusting the attenuation peak to a frequency of 3420 MHz to 3820 MHz, two times that of DCS/PCS Tx, a frequency of 3520 MHz to 3660 MHz, four times that of the EGSM transmission can also be simultaneously attenuated. As a result, a frequency two times that of the DCS/PCS transmission, and a frequency four times that of the EGSM transmission can be simultaneously attenuated. In addition, because the parallel resonance circuits L3, C3 have also a function as a matching circuit, it may be utilized for matching control in the entire antenna switch.

An electrostatic-surge-removing circuit may also be disposed in the above other embodiments. Though explanation is made here with respect to a case where the electrostatic-surge-removing circuit is connected to an antenna top, this electrostatic-surge-removing circuit can be not only connected to the antenna top but also disposed in plural sites, because it advantageously provides matching in a sufficiently wide band from 900 MHz to 2 GHz. For instance, the electrostatic-surge-removing circuit can properly be disposed between the diplexer Dip and the notch filter NF, between the diplexer Dip and the high-frequency switch SW, between the high-frequency switch SW and the lowpass filter LPF, between the high-frequency switch SW and the duplexer Dup, between the diplexer Dip and the surface acoustic wave filter SAW, etc.

[3] Composite Laminate Multiband Antenna Switch Module

In the composite laminate multiband antenna switch module of the present invention, part of transmission lines and capacitors constituting a diplexer and switch circuits constituting the multiband antenna switch circuit are integrally formed inside the laminate substrate, so that the wiring of the diplexer and the switch circuits is also formed on the surface of or inside the laminate substrate, resulting in decreased wiring loss and easy matching control between them. On the other hand, switch elements such as pin diodes and GaAs switches and chip parts such as resistors, capacitors and inductors constituting part of the multiband antenna switch circuit are mounted onto the laminate substrate, to provide a small, inexpensive composite laminate multiband antenna switch module.

A combination of the composite laminate multiband antenna switch module and a duplexer provides a multimode, multiband antenna switch circuit adapted not only for the switching of transmission and receiving in W-CDMA but also for multiple access of GSM and CDMA, and thus suitable for mobile phones. A communications device comprising such multiband antenna switch circuit or composite laminate multiband antenna switch module is small and operable at a low power consumption.

EXAMPLE 15

Figure 28:
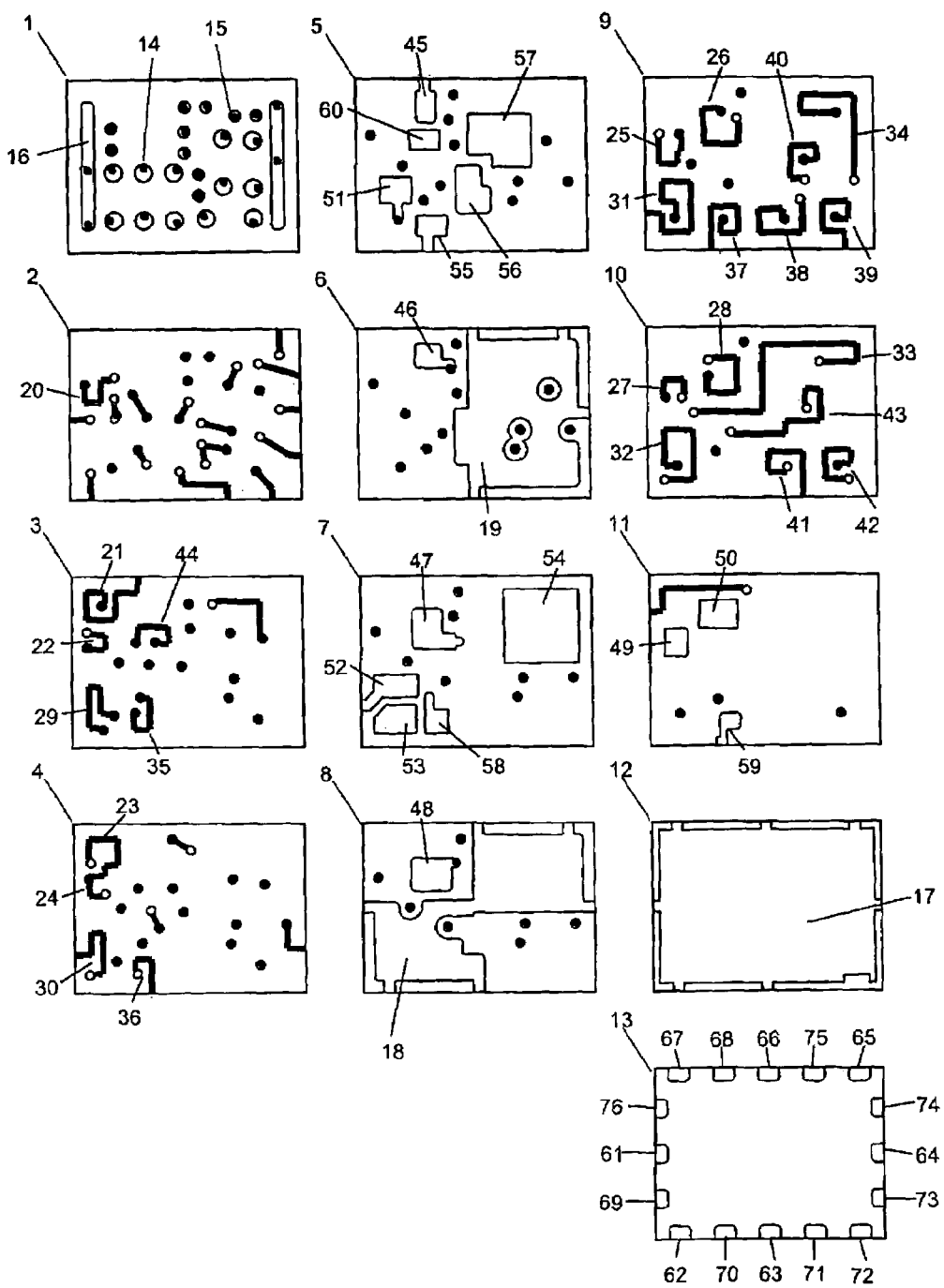
FIG. 28 is a view showing electrode patterns on green sheets constituting one example of the composite laminate antenna switch module of the present invention having the equivalent circuit shown in FIG. 10.

FIG. 28 shows green sheets and electrode patterns constituting the composite laminate antenna switch module having the equivalent circuit shown in Example 2. Green sheets 1 to 12 are laminated in this order from above. The green sheet 1 is printed with land electrodes 14 for mounting diodes, chip resistors and chip capacitors, and a land electrode 16 for mounting a metal shield (metal case). Also, via-hole electrodes 15 (shown by the black circles in the figure) are formed in the green sheets to connect the electrode patterns formed on different green sheets. A bottom surface 13 of the green sheet 12 is provided with ground terminals 61 to 67, an antenna terminal 68, an EGSM transmission terminal 69, a DCS transmission terminal 70, a W-CDMA transmitting/receiving terminal 71, a DCS receiving terminal 72, an EGSM receiving terminal 73, and power supply terminals 74 to 76. The green sheets 2, 3, 4, 9, 10 are printed with line electrode patterns mainly constituting transmission lines, and the green sheets 5, 6, 7, 8, 11 are printed with electrode patterns mainly constituting capacitors. The green sheets 6, 8, 12 are printed with ground electrodes 17 to 19.

The correspondence of the above laminate structure to the equivalent circuit shown in FIG. 10 will be explained in detail below. In FIG. 28, reference numerals 20 to 28 show electrode patterns for transmission lines constituting the diplexer Dip. The electrode patterns 21, 23 form a transmission line L1, the electrode patterns 25, 27 form a transmission line L2, the electrode patterns 20, 22 form a transmission line L3, and the electrode patterns 26, 28 form a transmission line L4.

Reference numerals 45 to 50 show electrode patterns forming capacitors constituting the diplexer Dip. The electrode patterns 45, 46 form a capacitor C2, the electrode patterns 47, 48 form a capacitor C4, the electrode pattern 49 and the ground electrode 17 form a capacitor C1, and the electrode pattern 50 and the ground electrode 17 form a capacitor C3.

Reference numerals 29 to 34 show electrode patterns forming transmission lines constituting the switch circuit SW1. The electrode patterns 29, 30 form a transmission line L11, the electrode patterns 31, 32 form a transmission line L5, and the electrode patterns 33, 34 form a transmission line L6.

Reference numerals 51 to 54 show electrode patterns forming capacitors constituting the switch circuit SW1. The electrode patterns 51, 52 form a capacitor C11, the electrode pattern 53 and the ground electrode 18 form a capacitor C12, the electrode pattern 52 and the ground electrode 18 form a capacitor C13, and the electrode pattern 54 and the ground electrode 18 form a capacitor C6.

Reference numerals 35 to 43 show electrode patterns forming transmission lines constituting the switch circuit SW2. The electrode patterns 35, 36 form a transmission line L12, the electrode pattern 37 forms a transmission line L7, the electrode patterns 38, 41 form a transmission line L10, the electrode patterns 39, 42 form a transmission line L9, and the electrode patterns 40, 43 form a transmission line L8.

Reference numerals 55 to 59 show electrode patterns forming capacitors constituting the switch circuit SW2. The electrode patterns 55, 58 form a capacitor C14, the electrode pattern 56 and the ground electrode 19 form a capacitor C10, the electrode pattern 57 and the ground electrode 19 form a capacitor C7, the electrode pattern 58 and the ground electrode 18 form a capacitor C15, the electrode pattern 59 and the ground electrode 17 form a capacitor C16. The electrode pattern 44 forms transmission lines constituting the notch filter NF, and the electrode pattern 60 forms a capacitor constituting the notch circuit NF. The through-hole electrodes 15 perform electric connection between the sheets.

Figure 29:
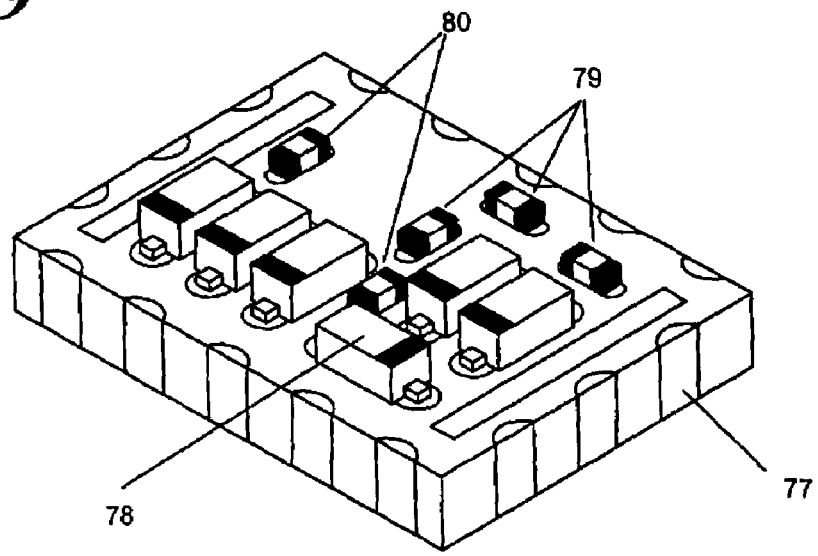
FIG. 29 is a perspective view showing the composite laminate antenna switch module shown in FIG. 28.
Figure 33:
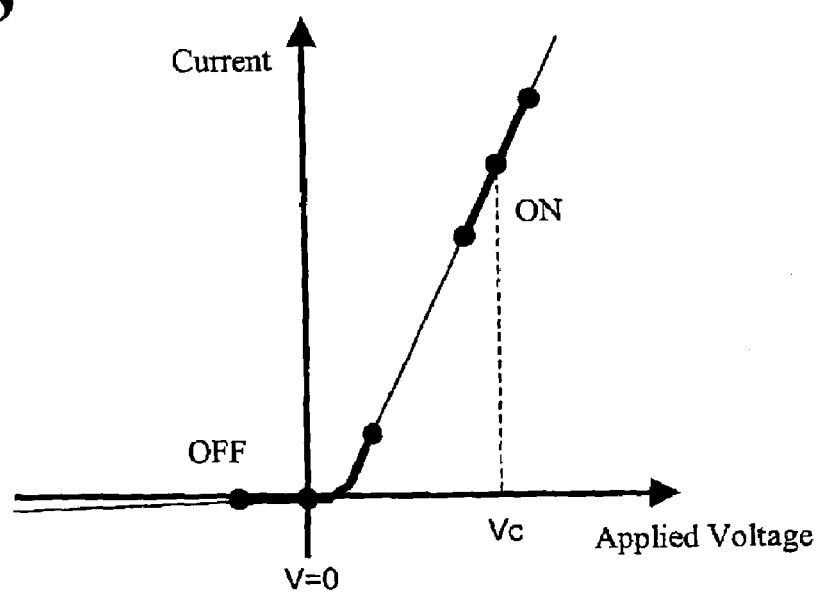
FIG. 33 is a view showing an operating point of the pin diode.
Figure 30:
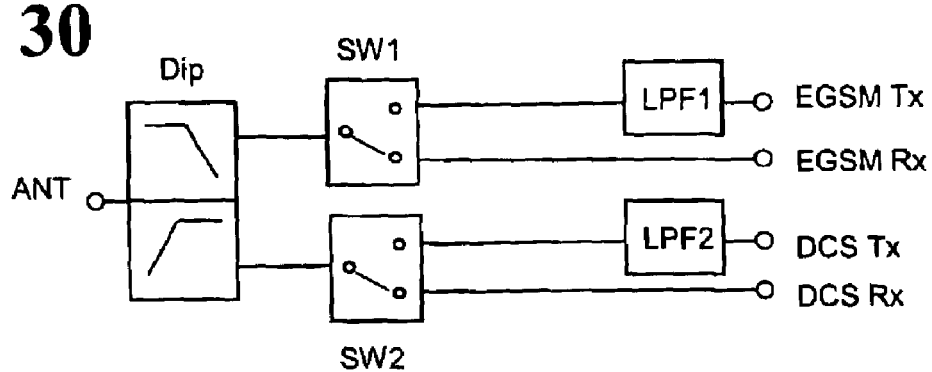
FIG. 30 is a block diagram showing a conventional antenna switch circuit adapted for EGSM and DCS.

Green sheets used in this embodiment are made of dielectric ceramic materials co-fireable at as low temperatures as 950° C. or lower, and their thickness is preferably 40 to 200 µm so that electrode patterns and ground electrodes for transmission lines and capacitors are easily formed. After the ceramic green sheets 1 to 12 are laminated and printed with a side electrode 77, they are fired at 950° C. to obtain a laminate for the composite laminate antenna switch module. As shown in FIG. 29, a diode 78, a chip resistor 79, and a chip capacitor 80 are mounted onto the laminate to obtain a composite laminate antenna switch module having the equivalent circuit shown in FIG. 10.

Though specific explanation has been made above on the multiband antenna switch circuit adapted for EGSM, DCS, DAMPS, PCS and W-CDMA, the same effects can also be expected in other multiband antenna switch circuits combining any of PDC800 (810 to 960 MHz), GPS (1575.42 MHz), PHS (1895 to 1920 MHz), Bluetooth (2400 to 2484 MHz), CDMA 2000 expected to be spread in the U.S., TD-SCDMA expected to be spread in China, etc. Accordingly, the present invention provides multimode, multiband antenna switch circuits adapted for dualband, tripleband, 4-band, 5-band, etc., with suppressed harmonic generation and suppressed breakdown of high-frequency parts due to electrostatic surge. Because these functions can be contained in the laminate, communications equipment such as mobile phones comprising such laminate modules can be made smaller in size and lower in power consumption.

APPLICABILITY IN INDUSTRY

Using the electrostatic-surge-removing circuit of the present invention, electrostatic surge from the antenna terminal can be released to the ground to absorb the electrostatic surge in a wide frequency band, thereby providing sufficient measures for electrostatic breakdown. Because circuit parts constituting the multiband antenna switch circuit, such as pin diode switches or GaAs FET switches, SAW filters for receiving, power amplifiers connected to transmission terminals, low-noise amplifiers connected to receiving terminals can be protected from electrostatic surge, these high-frequency electronic parts disposed downstream of the antenna are not subjected to breakdown.

The multiband antenna switch circuit of the present invention can effectively suppress harmonic generation. Because part of transmission lines and capacitors for the diplexer and the switch circuits are integrally contained in the laminate substrate, wiring between the diplexer and the switch circuits is also formed on a surface of or in the laminate substrate, resulting in decreased wiring loss and easy matching control therebetween. Because chip parts such as switch elements, resistors, capacitors and inductors, etc. are mounted onto the laminate substrate, it is possible to obtain a small, high-performance, composite laminate antenna switch module integrally containing an electrostatic-surge-removing circuit.

Communications apparatuses comprising these multiband antenna switch circuits or composite laminate multiband antenna switch modules are small in size and low in power consumption.

What is claimed is:

1. A filter circuit comprising a highpass filter and a serial resonance circuit between an input terminal and an output terminal, wherein said highpass filter comprises a first inductor connected between said input terminal and a ground, a first capacitor connected between said input terminal and said output terminal, and said serial resonance circuit comprises a second inductor connected to said output terminal and a second capacitor connected to said second inductor and said ground, such that said serial resonance circuit's resonance frequency is 100 to 500 MHz, whereby said serial resonance circuit is used for electrostatic surge measures.

2. The filter circuit according to claim 1, wherein a parallel resonance circuit comprising a third inductor and a third capacitor is disposed between said second inductor and said output terminal.

3. A multiband antenna switch circuit comprising a diplexer connected to an antenna terminal for branching signals having different passbands; a first switch circuit for switching lower-frequency signals branched by said diplexer to plural transmitting/receiving terminals; a second switch circuit for switching higher-frequency signals branched by said diplexer to plural transmitting/receiving terminals; a first lowpass filter connected to a transmitting line between said diplexer and said transmission terminal or between said first switch circuit and said transmission terminal; a second lowpass filter connected to a transmitting line between said diplexer and said transmission terminal or between said second switch circuit and said transmission terminal; and a notch filter disposed between said diplexer and said first switch circuit and/or between said diplexer and said second switch circuit.

4. A multiband antenna switch circuit comprising a diplexer connected to an antenna terminal for branching signals having different passbands; a first switch circuit for switching lower-frequency signals branched by said diplexer to a first transmission terminal and a first receiving terminal; a second switch circuit for switching higher-frequency signals branched by said diplexer to a second transmission terminal, a second receiving terminal and a third transmitting/receiving terminal; a first lowpass filter connected to a transmitting line between said diplexer and said first transmission terminal or between said first switch circuit and said first transmission terminal; and a second lowpass filter connected to a transmitting line between said diplexer and said second transmission terminal or between said second switch circuit and said second transmission terminal, said diplexer and said second switch circuit being connected to each other via a notch filter.

5. A multiband antenna switch circuit comprising a diplexer for branching signals having different passbands; a first switch circuit for switching lower-frequency signals branched by said diplexer to plural transmitting/receiving terminals; a second switch circuit for switching higher-frequency signals branched by said diplexer to plural transmitting/receiving terminals; a first lowpass filter connected to a transmitting line between said diplexer and a transmission terminal or between said first switch circuit and said transmission terminal; and a second lowpass filter connected to a transmitting line between said diplexer and said transmission terminal or between said second switch circuit and said transmission terminal, wherein a notch filter is connected between said diplexer and said antenna terminal.

6. A multiband antenna switch circuit comprising a diplexer for branching signals having different passbands; a first switch circuit for switching lower-frequency signals branched by said diplexer to a first transmission terminal and a first receiving terminal; a second switch circuit for switching higher-frequency signals branched by said diplexer to a second transmission terminal, a second receiving terminal and a third transmitting/receiving terminal; a first lowpass filter connected to a transmitting line between said diplexer and said first transmission terminal or between said first switch circuit and said first transmission terminal; and a second lowpass filter connected to a transmitting line between said diplexer and said second transmission terminal or between said second switch circuit and said second transmission terminal, wherein a notch filter is connected between said diplexer and said antenna terminal.

7. The multiband antenna switch circuit according to claim 4, wherein a duplexer is connected to said third transmitting/receiving terminal.

8. The multiband antenna switch circuit according to claim 6, wherein a duplexer is connected to said third transmitting/receiving terminal.

9. The multiband antenna switch circuit according to any one of claims 3 to 8, wherein it has an input terminal and an output terminal; and wherein a highpass filter comprising a first inductor connected between said input terminal and a ground, a first capacitor connected between said input terminal and said output terminal, a second inductor connected to said output terminal, and a second capacitor connected to said second inductor and said ground is disposed in said circuit.

10. The multiband antenna switch circuit according to claim 7, wherein a parallel resonance circuit comprising a third inductor and a third capacitor is disposed between the second inductor of said highpass filter and said output terminal.

11. A multiband antenna switch circuit comprising a notch filter connected between a switch circuit and an antenna terminal;

(b) said switch circuit comprising at least a connection terminal connected to said notch filter, a first transmitting/receiving terminal and a second transmitting/receiving terminal;

(c) a first diplexer comprising a first common terminal connected to said first transmitting/receiving terminal, a first transmitting terminal and a second receiving terminal; and (d) a second diplexer comprising a second common terminal connected to said second transmitting/receiving terminal, a second transmitting terminal and a first receiving terminal.

12. The multiband antenna switch circuit according to claim 11, wherein said notch filter comprises an inductor, a diode, a capacitor, a resistor and a power supply terminal, and its resonance frequency is adjustable by voltage applied to said power supply terminal.

13. The multiband antenna switch circuit according to claim 11, wherein said notch filter comprises an inverse voltage terminal for applying inverse voltage to said diode.

14. The multiband antenna switch circuit according to claim 12, wherein said notch filter comprises an inverse voltage terminal for applying inverse voltage to said diode.

15. The multiband antenna switch circuit according to any one of claims 11 to 14, wherein it comprises a highpass filter in said circuit; and wherein said highpass filter comprises an input terminal, an output terminal, a first inductor connected between said input terminal and a ground, a first capacitor connected between said input terminal and said output terminal, a second inductor connected to said output terminal, and a second capacitor connected to said second inductor and said ground.

16. The multiband antenna switch circuit according to claim 15, wherein a parallel resonance circuit comprising a third inductor and a third capacitor is disposed between the second inductor of said highpass filter and said output terminal.

17. The multiband antenna switch circuit according to any one of claims 11 to 14, comprising a first lowpass filter connected to said first transmitting terminal, and a second lowpass filter connected to said second transmitting terminal.

18. The multiband antenna switch circuit according to any one of claims 11 to 14, wherein said switch circuit is formed by a GaAs semiconductor.

19. A composite laminate multiband antenna switch module constituted by a laminate comprising plural substrates, wherein part of transmission lines and capacitors constituting the multiband antenna switch circuit recited in any one of claims 3 to 8 and 11 to 14 are formed on substrates in said laminate; and wherein switch elements, resistors, capacitors and inductors constituting part of said multiband antenna switch circuit are mounted onto said laminate as chip parts.

20. A communications device comprising the multiband antenna switch circuit recited in any one of claims 3 to 8 and 11 to 14.

21. A communications device comprising the composite laminate multiband antenna switch module recited in claim 19.

* * * * *

UNITED STATES PATENT AND TRADEMARK OFFICE
CERTIFICATE OF CORRECTION

| | |
|---|---|
| PATENT NO. | : 7,057,472 B2 |
| APPLICATION NO. | : 10/486326 |
| DATED | : June 6, 2006 |
| INVENTOR(S) | : Kelsuki Fukamachi et al. |

Page 1 of 1

It is certified that error appears in the above-identified patent and that said Letters Patent is hereby corrected as shown below:

On the title page, item (57), Abstract, line 14, "die" should read --the--.

In claim 10, column 30, line 43, "claim 7," should read --claim 9,--.

In claim 11, column 30, line 48, "a notch" should read --(a) a notch--.

Signed and Sealed this

Eighth Day of August, 2006

JON W. DUDAS
*Director of the United States Patent and Trademark Office*